(12) United States Patent  (10) Patent No.: US 8,334,495 B2
Koyama et al.  (45) Date of Patent: Dec. 18, 2012

(54) PHOTOMETRIC DEVICE INCLUDING A PHOTOELECTRIC CONVERSION ELEMENT FOR DETECTING ILLUMINANCE OF LIGHT

(75) Inventors: Jun Koyama, Kanagawa (JP); Seiko Amano, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 625 days.

(21) Appl. No.: 12/487,287

(22) Filed: Jun. 18, 2009

(65) Prior Publication Data

US 2009/0324244 A1 Dec. 31, 2009

(30) Foreign Application Priority Data

Jun. 25, 2008 (JP) ................................. 2008-166334

(51) Int. Cl.
*G01J 1/44* (2006.01)
(52) U.S. Cl. .................................... 250/214 R; 356/922
(58) Field of Classification Search .................. 250/200, 250/214 R; 356/213–236; 341/126, 155–165
See application file for complete search history.

(56) References Cited

U.S. PATENT DOCUMENTS

| | | | | |
|---|---|---|---|---|
| 4,412,342 | A * | 10/1983 | Khan et al. .................... | 375/356 |
| 5,214,274 | A | 5/1993 | Yang | |
| 6,774,735 | B2 * | 8/2004 | Senthilkumar et al. ....... | 331/158 |
| 7,532,044 | B2 | 5/2009 | Suzuki et al. | |
| 2003/0222206 | A1 * | 12/2003 | Azary et al. ............ | 250/214 AG |
| 2006/0273830 | A1 | 12/2006 | Suzuki et al. | |
| 2008/0054159 | A1 * | 3/2008 | Yu et al. ........................ | 250/205 |
| 2008/0204085 | A1 | 8/2008 | Suzuki et al. | |
| 2010/0226495 | A1 * | 9/2010 | Kelly et al. ....................... | 380/30 |

FOREIGN PATENT DOCUMENTS

| | | |
|---|---|---|
| EP | 1 619 509 A1 | 1/2006 |
| EP | 1 767 911 A1 | 3/2007 |
| JP | 6-313840 | 11/1994 |
| JP | 2002-286504 | 10/2002 |
| JP | 2004-325409 | 11/2004 |

OTHER PUBLICATIONS

European Search Report (Application No. 09163027.7) dated Oct. 23, 2009.

* cited by examiner

*Primary Examiner* — Thanh Luu
*Assistant Examiner* — Renee Naphas
(74) *Attorney, Agent, or Firm* — Nixon Peabody LLP; Jeffrey L. Costellia

(57) ABSTRACT

A photometric device with a wide dynamic range. The photometric device includes a constant current generation circuit, a fixed clock signal generation circuit which generates a fixed clock signal having a fixed frequency, a photoelectric conversion element, a variable clock signal generation circuit, and a digital signal generation circuit. The fixed clock signal generation circuit generates a fixed clock signal that oscillates at a fixed frequency, from constant current. The variable clock signal generation circuit generates a variable clock signal that oscillates at a frequency proportional to the amount of photocurrent, from photocurrent generated in the photoelectric conversion element. The digital signal generation circuit sets a measurement period using the fixed clock signal, counts the number of pulses of the variable clock signal that oscillates for the measurement period, and outputs a digital signal including the count value as data.

13 Claims, 16 Drawing Sheets

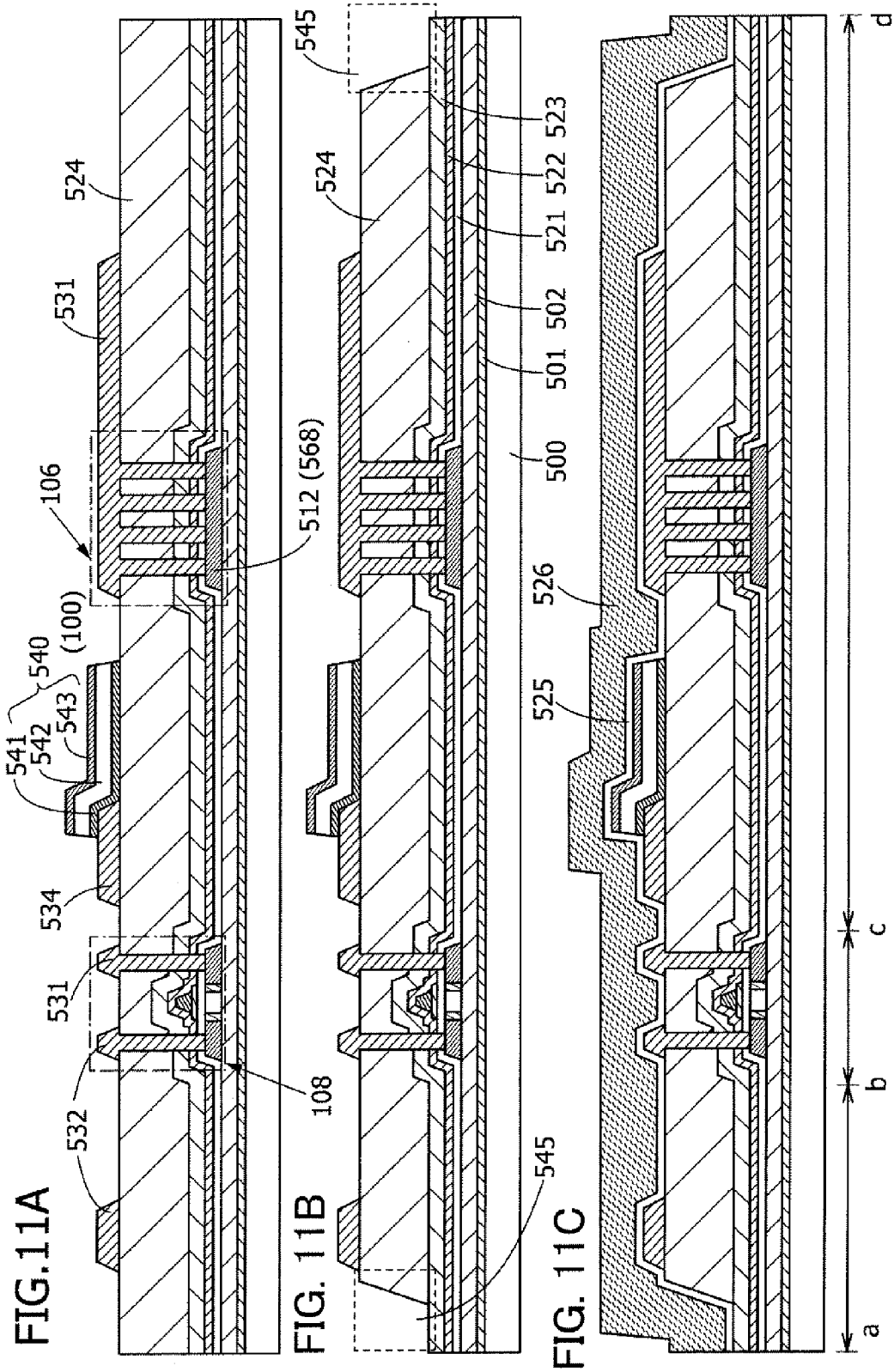

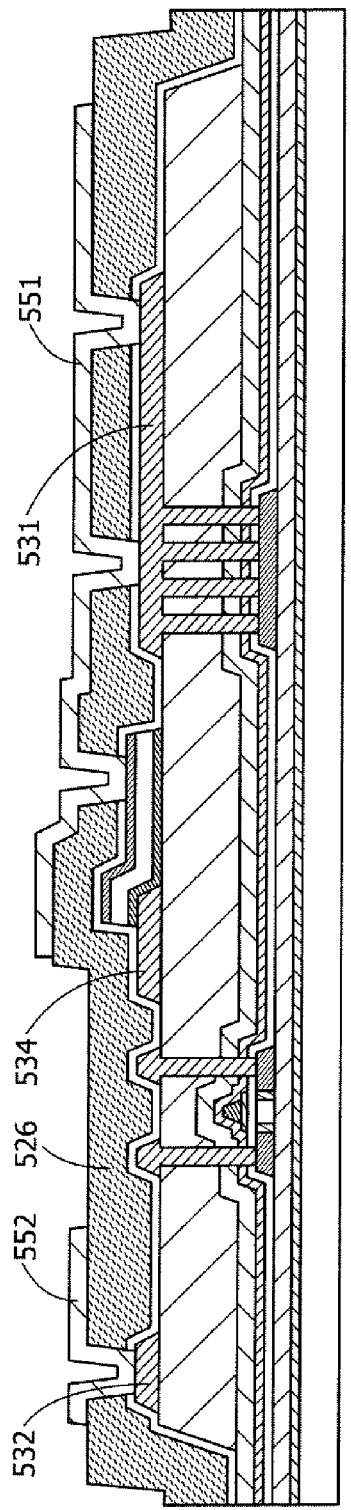
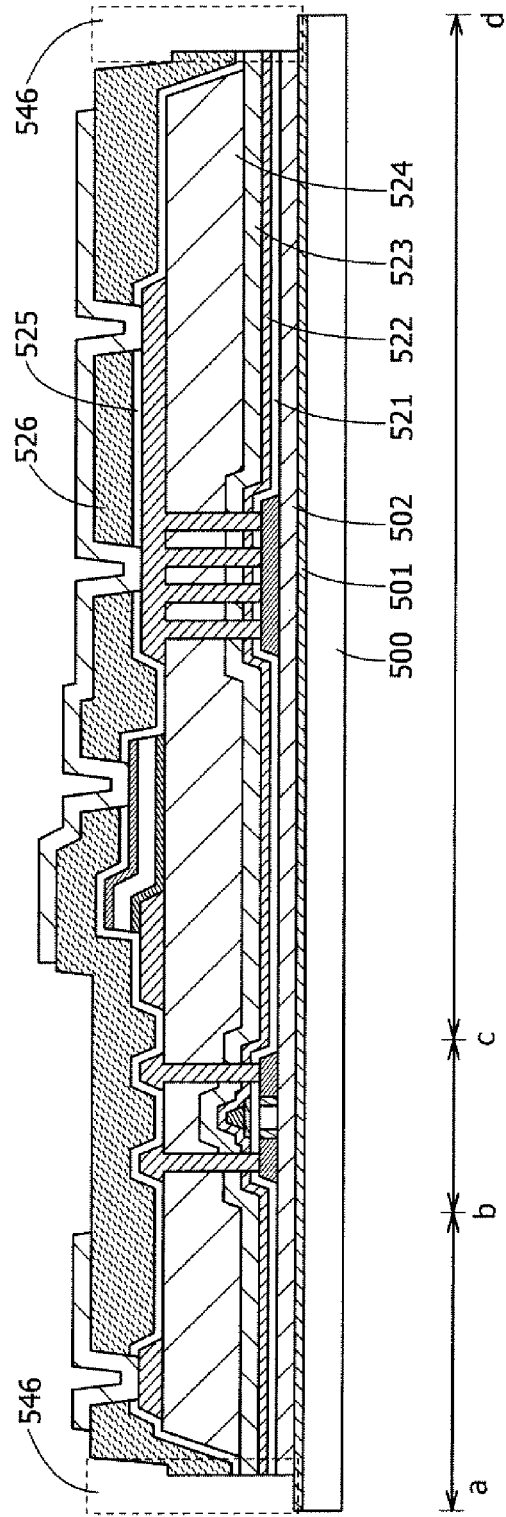
FIG. 12A
FIG. 12B

FIG. 15B
FIG. 15A
FIG. 15C
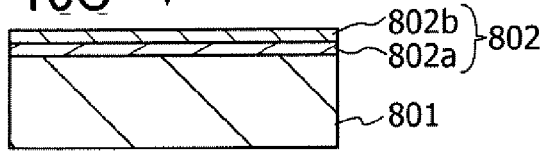
FIG. 15D
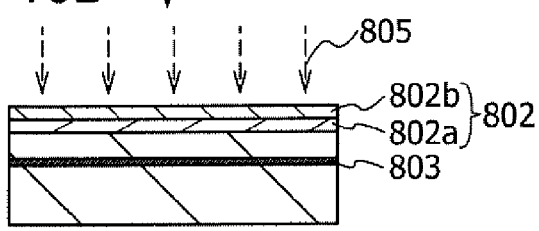
FIG. 15E
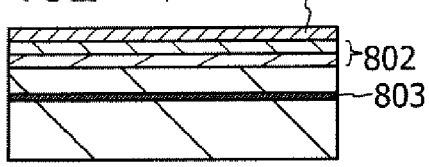
FIG. 15F
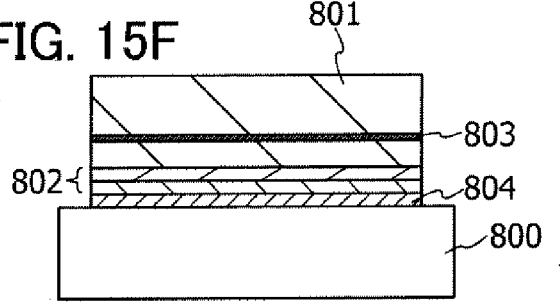
FIG. 15G
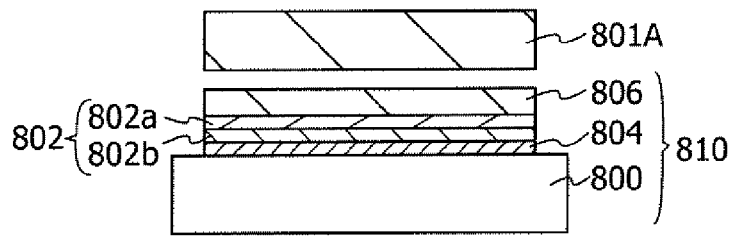

PHOTOMETRIC DEVICE INCLUDING A PHOTOELECTRIC CONVERSION ELEMENT FOR DETECTING ILLUMINANCE OF LIGHT

BACKGROUND OF THE INVENTION

1. Field of the Invention

The present invention relates to a photometric device which detects the illuminance or the amount of light.

2. Description of the Related Art

A photoelectric conversion element such as a photodiode generates photocurrent corresponding to the illuminance of light with which the photoelectric conversion element is irradiated. The illuminance of light can be measured by detecting the amount of the photocurrent. An optical sensor which amplifies photocurrent generated in a photodiode to be output as a current signal (an analog signal) by using the above mechanism has been put into practical use.

Further, electronic devices provided with an optical sensor, such as a television receiver and a mobile phone, have been commercialized. Such products have a function of adjusting the luminance of a display screen by detecting the illuminance of usage environment by the optical sensor. Therefore, in an electronic device which is controlled and operated by a digital signal, an output from the optical sensor is required to be a digital signal.

For example, Patent Document 1 discloses an optical sensor in which electric charge stored in a capacitor with photocurrent is discharged with constant current and the amount of electric charge generated in a photodiode is measured using the discharging period. The optical sensor in Patent Document 1 measures the discharging period by counting the number of pulses of a clock signal and generates a digital signal including the count value as data.

REFERENCE

Patent Document 1: Japanese Published Patent Application No. H6-313840

SUMMARY OF THE INVENTION

The optical sensor in Patent Document 1 can output a digital signal; however, the dynamic range is limited by a capacitance value of the capacitor. Therefore, an object of an embodiment of the present invention is to provide a device that detects the illuminance (or the amount) of light with few limitations on the dynamic range.

A photometric device according to one embodiment of the present invention includes a constant current generation circuit configured to output a constant current; a first clock signal generation circuit configured to generate a first clock signal that oscillates at a frequency proportional to the constant current; a photoelectric conversion element configured to generate a photocurrent when receiving light; a second clock signal generation circuit configured to generate a second clock signal that oscillates at a frequency proportional to the photocurrent; and a digital signal generation circuit configured to count the number of pulses of the second clock signal for a certain period and output a digital signal including a count value of the number of pulses as data. In the digital signal generation circuit according to one embodiment, a timing when counting of the number of pulses of the second clock signal starts and a timing when the counting finishes are set based on the first clock signal.

In the photometric device in the above embodiment, the first clock signal generation circuit may include an amplifier circuit for amplifying the constant current, which is constituted by a current mirror circuit or the like. The second clock signal generation circuit may include an amplifier circuit for amplifying the photocurrent, which is constituted by a current mirror circuit or the like. Moreover, the first clock signal generation circuit can have the same structure as the second clock signal generation circuit.

A photometric device according to another embodiment of the present invention includes a constant current generation circuit configured to output a constant current; a first clock signal generation circuit configured to generate a first clock signal that oscillates at a frequency proportional to the constant current; a photoelectric conversion element configured to generate a photocurrent when receiving light; a second clock signal generation circuit configured to generate a second clock signal that oscillates at a frequency proportional to the photocurrent; and a digital signal generation circuit configured to count the number of pulses of the second clock signal for a certain period and output a digital signal including a count value of the number of pulses as data. In the digital signal generation circuit, a timing when counting of the number of pulses of the second clock signal starts and a timing when the counting finishes are set based on the first clock signal. The second clock signal generation circuit includes a photocurrent amplifier circuit which includes a first amplifier circuit configured to amplify the photocurrent and a second amplifier circuit having an amplification factor different from that of the first amplifier circuit, and outputs a first amplified photocurrent amplified by the first amplifier circuit and a second amplified photocurrent amplified by the second amplifier circuit; a gain switching circuit configured to output one of the first amplified photocurrent and the second amplified photocurrent which are input to the gain switching circuit; and a clock signal generation circuit configured to generate a second clock signal that oscillates at a frequency proportional to the photocurrent, from the current output from the gain switching circuit.

In the photometric device in the above embodiment, the first clock signal generation circuit may include an amplifier circuit for amplifying the constant current, which is constituted by a current mirror circuit or the like. Moreover, the first clock signal generation circuit can have the same structure as the second clock signal generation circuit.

According to one embodiment of the present invention, a photometric device with few limitations on the measurement range of the illuminance (or the amount) of light can be provided.

BRIEF DESCRIPTION OF THE DRAWINGS

In the accompanying drawings:

FIGS. 11A to 11C are cross-sectional views illustrating an example of steps after the step in FIG. 10D;

FIGS. 12A and 12B are cross-sectional views illustrating an example of steps after the step in FIG. 11C;

FIGS. 15A to 15G are cross-sectional views illustrating an example of a method of manufacturing an SOI substrate.

DETAILED DESCRIPTION OF THE INVENTION

Figure 1:
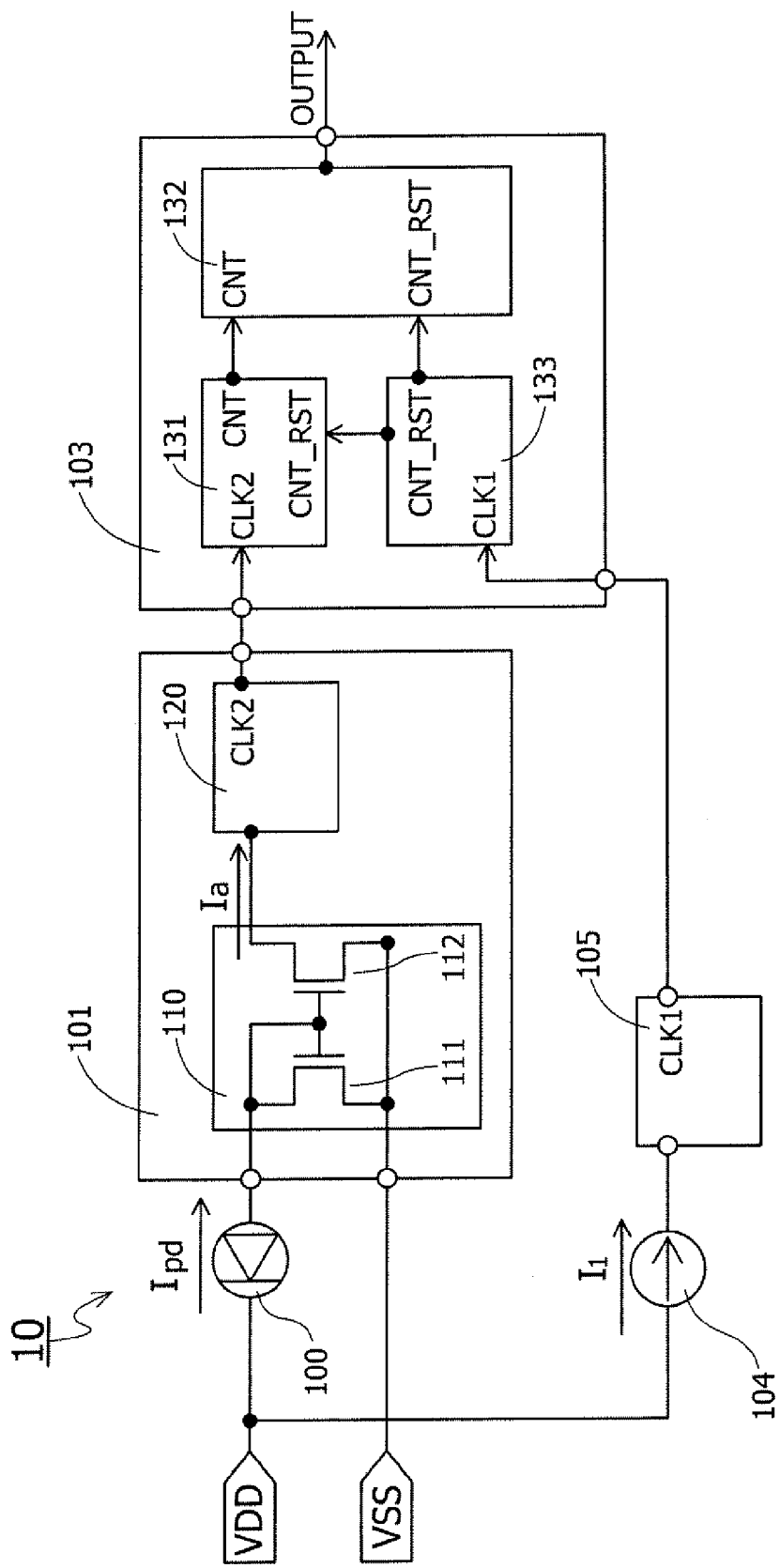
FIG. 1 is a block diagram illustrating an example of a structure of a photometric device.

Embodiments of the invention disclosed in this specification will be described with reference to the accompanying drawings. Note that the invention disclosed in this specification can be implemented in many different modes, and it is to be easily understood by those skilled in the art that modes and details of the invention disclosed in this specification can be variously changed without departing from the spirit and the scope of the invention disclosed in this specification. Therefore, the invention disclosed in this specification is not construed as being limited to the description of the embodiments. In addition, components denoted by the same reference numerals in different drawings are the same components; therefore, the description on such portions is not repeated.

Embodiment 1

A structure of a photometric device in this embodiment will be described with reference to FIG. 1. FIG. 1 is a block diagram illustrating a structure of a photometric device in this embodiment.

A photometric device 10 is a device that generates a digital signal including the illuminance of light received by a photoelectric conversion element as data. In this embodiment, the photoelectric conversion element is an element that converts received light into photocurrent (a current signal). In the photometric device 10 in FIG. 1, a photodiode is used as the photoelectric conversion element. As the photoelectric conversion element, a phototransistor or the like can be used other than the photodiode.

As illustrated in FIG. 1, the photometric device 10 in this embodiment includes a photodiode 100, a variable clock signal generation circuit 101, a digital signal generation circuit 103, a constant current generation circuit 104, and a fixed clock signal generation circuit 105. Moreover, as illustrated in FIG. 1, a high power supply potential VDD (hereinafter referred to as a power supply potential VDD) and a low power supply potential VSS (hereinafter referred to as a power supply potential VSS) are supplied to the photometric device 10 as power supply potentials. Note that the power supply potential VSS can be a ground potential.

The fixed clock signal generation circuit 105 generates a fixed clock signal that oscillates at a frequency proportional to the amount of constant current $I_1$, from constant current $I_1$ generated in the constant current generation circuit 104. Hereinafter, the clock signal that is generated in the fixed clock signal generation circuit 105 and has a fixed frequency is referred to as a clock signal CLK1. When a frequency of the clock signal CLK1 is denoted by $f_1$, $f_1$ satisfies Formula 1.

[Formula 1]

$$f_1 = Z_1 \times I_1 \text{ ($Z_1$ is a proportionality constant)} \quad (1)$$

Further, the variable clock signal generation circuit 101 generates a clock signal that oscillates at a frequency proportional to the photocurrent Ipd, from photocurrent Ipd generated in the photodiode 100. Hereinafter, the clock signal that is generated in the variable clock signal generation circuit 101 is referred to as a clock signal CLK2. When a frequency of the clock signal CLK2 is denoted by $f_2$, $f_2$ satisfies Formula 2.

[Formula 2]

$$f_2 = Z_2 \times Ipd \text{ ($Z_2$ is a proportionality constant)} \quad (2)$$

Moreover, the variable clock signal generation circuit 101 can include an amplifier circuit which amplifies the photocurrent Ipd generated in the photodiode 100 by x times (x≦1) or an attenuation circuit which attenuates the photocurrent Ipd by 1/x times (x>1). In this embodiment, FIG. 1 illustrates an example of a structure of the variable clock signal generation circuit 101 including an amplifier circuit. As illustrated in FIG. 1, the variable clock signal generation circuit 101 includes a photocurrent amplifier circuit 110 and a clock signal generation circuit 120 that generates the clock signal CLK2 which oscillates at a frequency proportional to the photocurrent Ipd, from a current signal amplified by the photocurrent amplifier circuit 110.

In this embodiment, the photocurrent amplifier circuit 110 is constituted by a current mirror circuit in order to amplify the photocurrent Ipd by one time. In FIG. 1, in order to amplify the photocurrent Ipd by one time, a current mirror circuit constituted by one transistor 111 for reference and one transistor 112 for amplification is employed for the photocurrent amplifier circuit 110. It is needless to say that the amplification factor of the photocurrent amplifier circuit 110 can be larger than one by providing a plurality of transistors 112 connected in parallel to each other. In this embodiment, it is preferable to connect 1 to 10 transistors 112 in parallel to each other, with respect to one transistor 111. More preferably, the number of transistors 112 is 1 to 5. Moreover, since n-channel transistors are used as the transistors 111 and 112 in the current mirror circuit in FIG. 1, the power supply potential VDD is supplied to a cathode of the photodiode 100, and an anode of the photodiode 100 is connected to the variable clock signal generation circuit 101.

When the photodiode 100 is irradiated with light, a resistance value of the photodiode 100 is decreased, and current (the photocurrent Ipd) corresponding to the resistance value of the photodiode 100 flows through the photodiode 100. Since a gate and a drain of the transistor 111 is connected to each other, when the photocurrent Ipd flows into the transistor 111, voltage corresponding to the channel resistance is generated in the gate of the transistor 111, and this voltage is applied to a gate of the transistor 112. The power supply potential VDD is applied to the drain of the transistor 111 and the power supply potential VSS is applied to a source of the transistor 111, whereby current flows into the transistor 112 and the current flowing through the photodiode 100 is amplified. In other words, the amount of amplified current Ia output from the photocurrent amplifier circuit 110 is related to the illuminance (or the amount) of light which enters the photodiode 100.

The clock signal generation circuit 120 generates a clock signal having a frequency proportional to the amount of current Ipd. Since the photocurrent Ipd and the amplified current Ia are proportional to each other, the clock signal generated in the clock signal generation circuit 120 is the clock signal that oscillates at a frequency proportional to the photocurrent Ipd, which is the clock signal CLK2.

The digital signal generation circuit 103 counts the number of pulses of the clock signal CLK2 for a certain period and outputs a digital signal including the count value as data. The clock signal CLK1 generated in the fixed clock signal generation circuit 105 is input to the digital signal generation circuit 103. The digital signal generation circuit 103 sets a period during which the number of pulses of the clock signal CLK2 is counted, based on the clock signal CLK1.

For example, the digital signal generation circuit 103 can be constituted by a plurality of functional circuits. As illustrated in FIG. 1, the digital signal generation circuit 103 includes a count circuit 131 which counts the number of pulses of the clock signal CLK2, a latch circuit 132 which holds a count value (CNT) obtained in the count circuit 131, and a counting period setting circuit 133 which sets a period for counting the number of pulses of the clock signal CLK2. The count circuit 131 and the latch circuit 132 are electrically connected through bus lines with the number corresponding to the number of bits of the count value.

To the count circuit 131, the clock signal CLK2 which represents the illuminance of light with which the photodiode 100 is irradiated is input from the clock signal generation circuit 120, and a reset signal CNT_RST is input from the counting period setting circuit 133. The count circuit 131 resets the count value of the number of pulses of the clock signal CLK2 (makes the count value 0) in accordance with the reset signal CNT_RST.

The reset signal CNT_RST is generated in the counting period setting circuit 133. The counting period setting circuit 133 generates the reset signal CNT_RST for controlling the latch circuit 132, from the clock signal CLK1. The reset signals CNT_RST are output to the count circuit 131 and the latch circuit 132.

Figure 2:
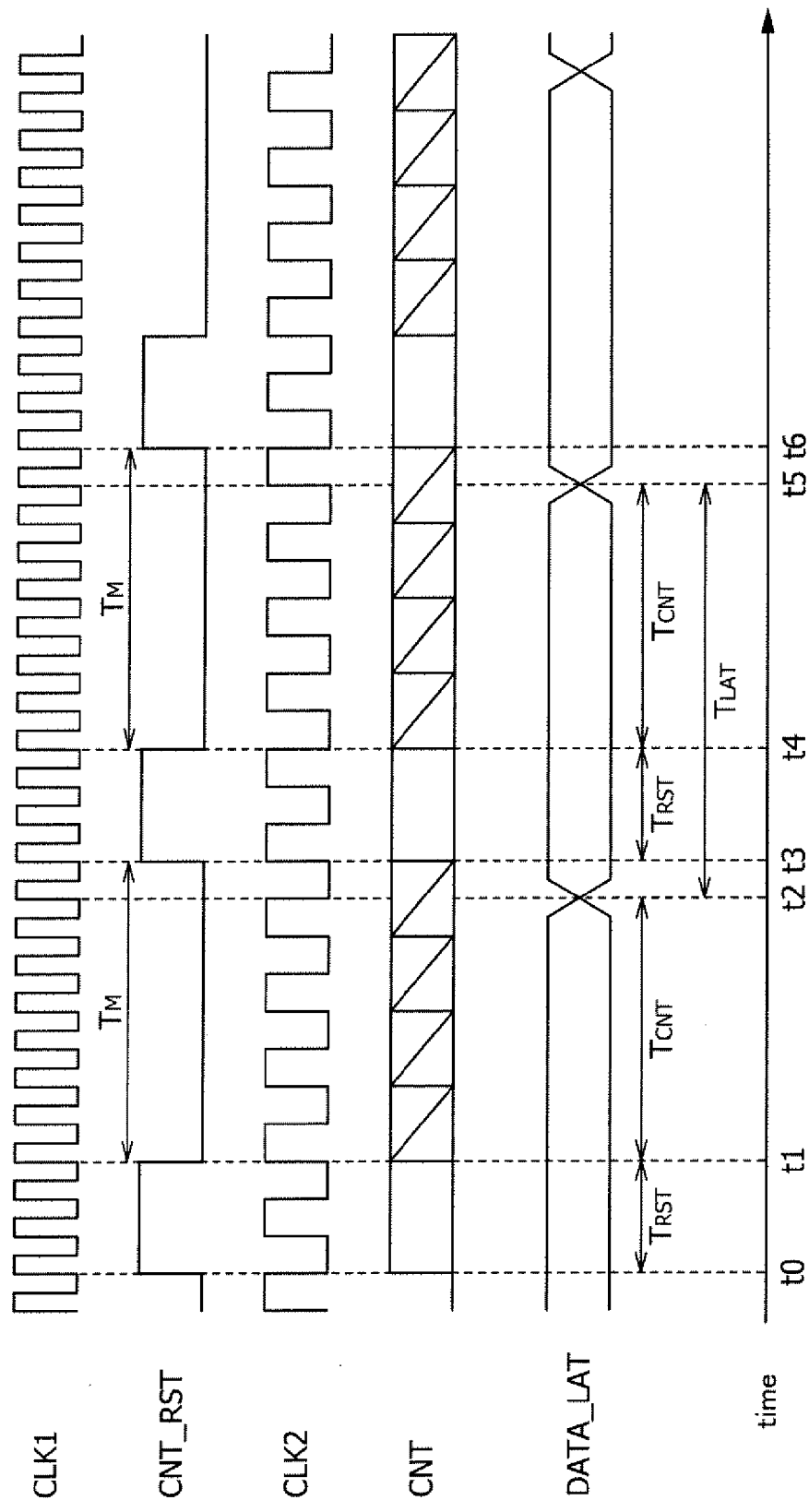
FIG. 2 is a timing chart of signals generated in the photometric device in FIG. 1.

An operation of the photometric device 10 will be described with reference to FIG. 2. FIG. 2 is a timing chart of signals generated in the photometric device 10. In the following description, the digital signal generation circuit 103 generates an 8-bit digital signal, and the frequency $f_2$ of the clock signal CLK2 is not changed in the timing chart of FIG. 2. Moreover in FIG. 2, DATA_LAT represents timing of rewriting data stored in the latch circuit 132.

As illustrated in FIG. 2, the fixed clock signal generation circuit 105 generates the clock signal CLK1 having the fixed frequency $f_1$, and the variable clock signal generation circuit 101 generates the clock signal CLK2 which oscillates at a frequency proportional to the photocurrent Ipd. Further, a cycle of the reset signal CNT_RST is proportional to a cycle of the clock signal CLK1, and the pulse width of the reset signal CNT_RST is proportional to the cycle of the clock signal CLK1. Here, the pulse width of the reset signal CNT_RST is set to three times the cycle of the clock signal CLK1.

In addition, since the count value CNT is represented by an 8-bit digital value here, a measurement period $T_M$ at which the illuminance of light is measured is set to eight times the cycle of the clock signal CLK1. As illustrated in FIG. 2, the measurement period $T_M$ is defined by the reset signal CNT_RST.

A period from the time t0 to the time t1 is a reset period $T_{RST}$ defined by the reset signal CNT_RST. In this reset period $T_{RST}$(t0-t1), the count circuit 131 resets the count value CNT to 0 in accordance with the reset signal CNT_RST. At the time t1, the count circuit 131 starts to count the number of pulses of the clock signal CLK2 and counts up the count value CNT from 0 one by one.

At the time t2, the count circuit 131 rewrites data stored in the latch circuit 132 in accordance with the reset signal CNT_RST. In other words, the count value CNT which is counted up in the count circuit 131 in a period (t1-t2) is written into the latch circuit 132. Here, the binary count value CNT of 0001000 is written into the latch circuit 132. The count value CNT is proportional to the frequency of the clock signal CLK2, and thus related to the amount of photocurrent Ipd generated in the photodiode 100.

In a period (t3-t4), the count value CNT of the count circuit 131 is reset to 0 again. Then, in a period (t4-t5), the count circuit 131 counts the number of pulses of the clock signal CLK2. At the time t5, the count value CNT obtained in the period (t4-t5) is written into the latch circuit 132.

The count value CNT of 0001000, which is obtained in a count period $T_{CNT}$(t1-t2), is held in the latch circuit 132 during the period (t2-t5). In other words, the period (t2-t5) is a latch period $T_{LAT}$ at which the latch circuit 132 holds the count value CNT obtained in the previous count period $T_{CNT}$ (t1-t2). In the latch period $T_{LAT}$(t2-t5), the latch circuit 132 outputs a digital signal including the holding count value CNT as data.

As described above, the photocurrent Ipd generated in the photodiode 100 can be converted into a digital signal by the photometric device 10. That is, a digital value corresponding to the illuminance of light received by the photodiode 100 can be obtained by the photometric device 10.

In addition, the photometric device 10 in this embodiment generates the clock signal CLK2 having a frequency corresponding to the amount of photocurrent generated in a photoelectric conversion element and counts the number of pulses of the clock signal CLK2 for a certain period; thus, there are few limitations on the detection range of photocurrent. Therefore, this embodiment makes it easy to provide a photometric device with a wide dynamic range.

In this embodiment, the variable clock signal generation circuit 101 and the fixed clock signal generation circuit 105 can have the same structure. In this case, it is preferable to make the variable clock signal generation circuit 101 and the fixed clock signal generation circuit 105 have the same operating characteristics. That is, it is preferable that the variable clock signal generation circuit 101 and the fixed clock signal generation circuit 105 have the same structure and that elements having the same electric characteristics be used as elements included in the circuits because errors due to variation in electrical operations of the elements included in the circuits can cancel each other out.

Embodiment 2

Figure 3:
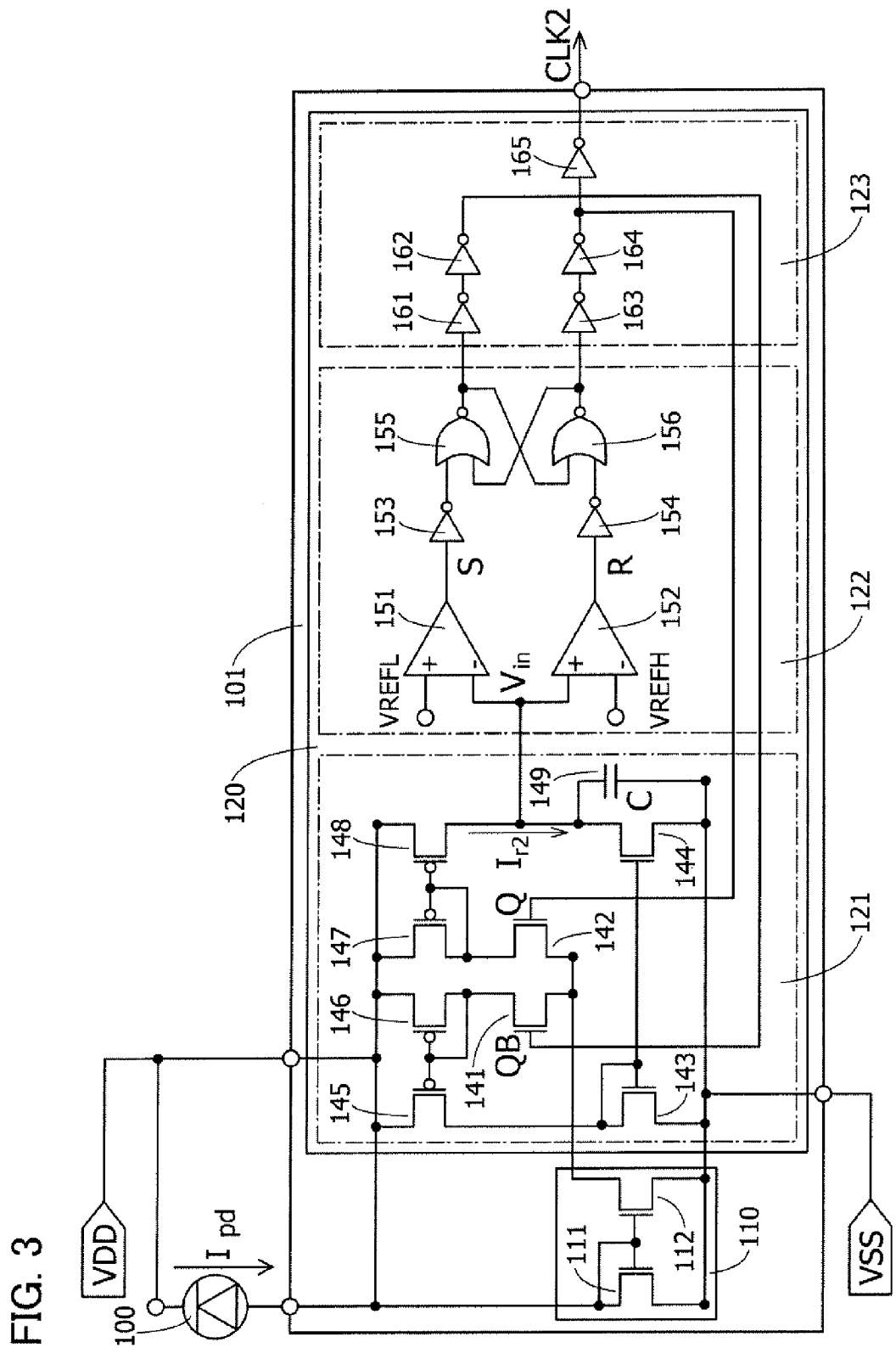
FIG. 3 is a circuit diagram illustrating an example of a structure of a variable clock signal generation circuit included in the photometric device in FIG. 1.

In this embodiment, specific structures of the variable clock signal generation circuit 101 and the fixed clock signal generation circuit 105 will be described. First, a structure of the variable clock signal generation circuit 101 will be described with reference to FIG. 3. FIG. 3 is a circuit diagram of the variable clock signal generation circuit 101.

As has been described in Embodiment 1, the variable clock signal generation circuit 101 includes the photocurrent amplifier circuit 110 and the clock signal generation circuit 120. The clock signal generation circuit 120 can be constituted by a plurality of functional circuits. In this embodiment, the clock signal generation circuit 120 is constituted by three functional circuits. The clock signal generation circuit 120 includes a ramp signal generation circuit 121, a hysteresis comparator circuit 122, and a buffer circuit 123. As in FIG. 1, the photocurrent amplifier circuit 110 is constituted by a current mirror circuit formed of two transistors 111 and 112.

The ramp signal generation circuit 121 includes four n-channel transistors 141 to 144, four p-channel transistors 145 to 148, and a capacitor 149 which are connected as illustrated in FIG. 3. The capacitor 149 repeats charging and discharging with current Ir2, whereby a ramp signal is output from the ramp signal generation circuit 121 to the hysteresis comparator circuit 122.

The hysteresis comparator circuit 122 includes two comparators 151 and 152, two inverter circuits 153 and 154, and two NOR circuits 155 and 156 which are connected as illustrated in FIG. 3. The output signal from the ramp signal generation circuit 121 is input to an inverting input terminal (−) of the comparator 151 and a non-inverting input terminal (+) of the comparator 152. A low reference potential VREFL is input to a non-inverting input terminal (+) of the comparator 151, and a high reference potential VREFH is input to an inverting input terminal (−) of the comparator 152.

The buffer circuit 123 includes five inverter circuits 161 to 165 connected as illustrated in FIG. 3. An output signal from the inverter circuit 165 is the clock signal CLK2. An output of the inverter circuit 162 is connected to a node QB (a gate of the n-channel transistor 141) in the ramp signal generation circuit 121. An output of the inverter circuit 164 is connected to a node Q (a gate of the n-channel transistor 142) in the ramp signal generation circuit 121.

Logic operations are performed in the logic circuits included in the hysteresis comparator circuit 122 and the buffer circuit 123, whereby the ramp signal generated in the ramp signal generation circuit 121 is converted into the clock signal CLK2 and output from the clock signal generation circuit 120.

Figure 4:
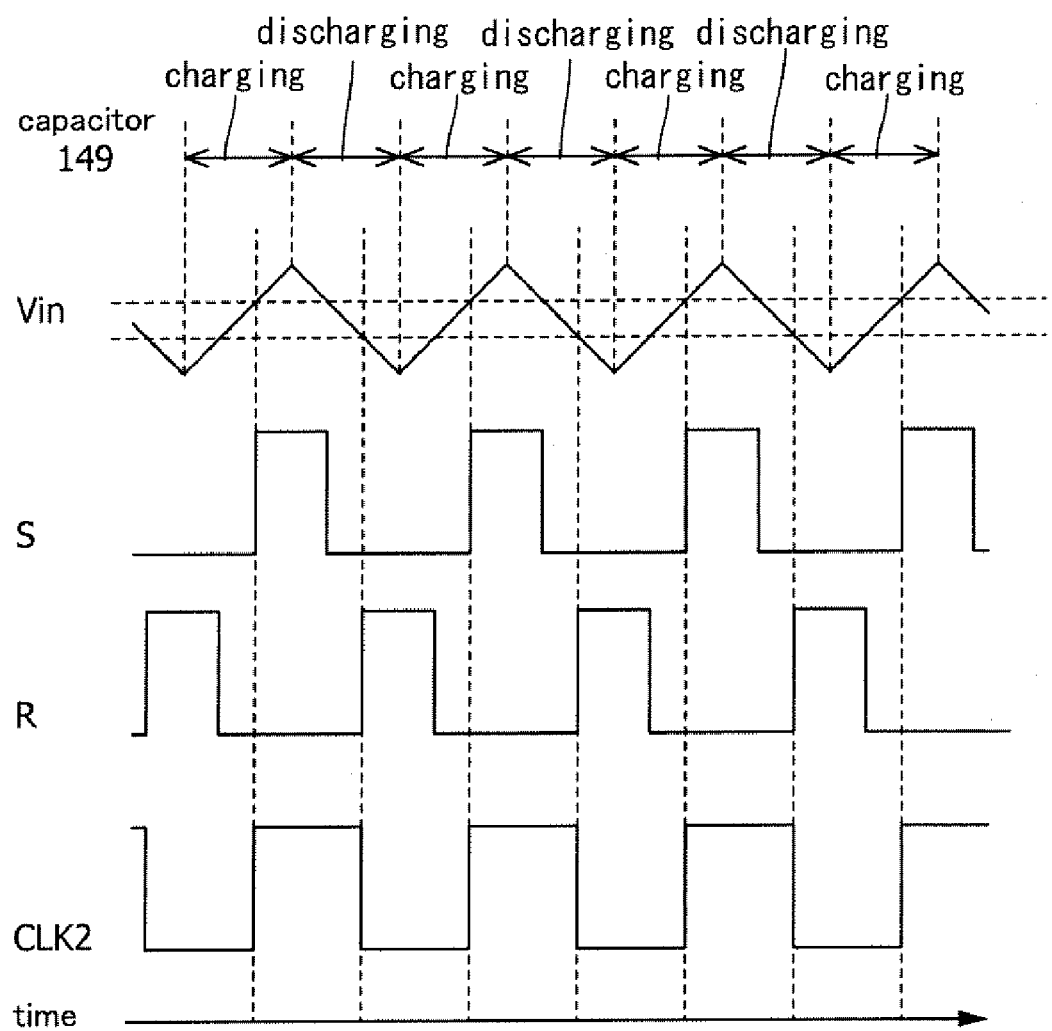
FIG. 4 is a timing chart of signals generated in the variable clock signal generation circuit in FIG. 3.

Functions of the clock signal generation circuit 120 will be described with reference to FIG. 4. FIG. 4 is a timing chart illustrating change of the potential of nodes Vin, Q, QB, S, and R and timing of charging and discharging of the capacitor 149.

The capacitor 149 repeats charging and discharging with the current Ir2, whereby the potential of the node Vin is changed into a ramp waveform. In other words, a ramp signal RMP is input to the node Vin. Change of the potential of the node Vin in FIG. 4 represents a signal waveform of the ramp signal RMP. The ramp signal RMP is input to the hysteresis comparator circuit 122. A frequency fr2 of the ramp signal RMP is represented by Formula 3 using a capacitance value $C_2$ of the capacitor 149 and the reference potentials VREFL and VREFH.

[Formula 3]

$$fr2 = \frac{1}{Tr2} = \frac{Ir2}{2 \times C_2(VREFH - VREFL)} \quad (3)$$

Moreover, since the current Ir2 is proportional to the photocurrent Ipd generated in the photodiode 100, the frequency fr2 of the ramp signal RMP is proportional to the photocurrent Ipd. Therefore, the relation between the frequency fr2 and the photocurrent Ipd can be represented by Formula 4. In Formula 4, $Z_4$ is a proportionality constant, which is a constant determined by the amplification factor of the photocurrent amplifier circuit 110, electric characteristics of the transistors 141 to 148 included in the ramp signal generation circuit 121, and the like.

[Formula 4]

$$fr2 = \frac{1}{Tr2} = Z_4 \frac{Ipd}{2 \times C_2(VREFH - VREFL)} \quad (4)$$

Further, the comparator 151 generates a square wave signal having the same cycle as the ramp signal RMP (see the potential of the node S). Moreover, the comparator 152 generates a square wave signal having the same cycle as the ramp signal RMP from the ramp signal (see the potential of the node R).

The logic circuits (153 to 156 and 161 to 165) generate the clock signal CLK2 from the output signal from the comparator 151 and the output signal from the comparator 152. As illustrated in FIG. 4, the frequency $f_2$ of the clock signal CLK2 is equal to the frequency fr2 of the ramp signal RMP. In other words, as represented by Formula 2, the clock signal CLK2 which oscillates at the frequency $f_2$ proportional to the photocurrent Ipd is output from the buffer circuit 123.

Figure 5A:
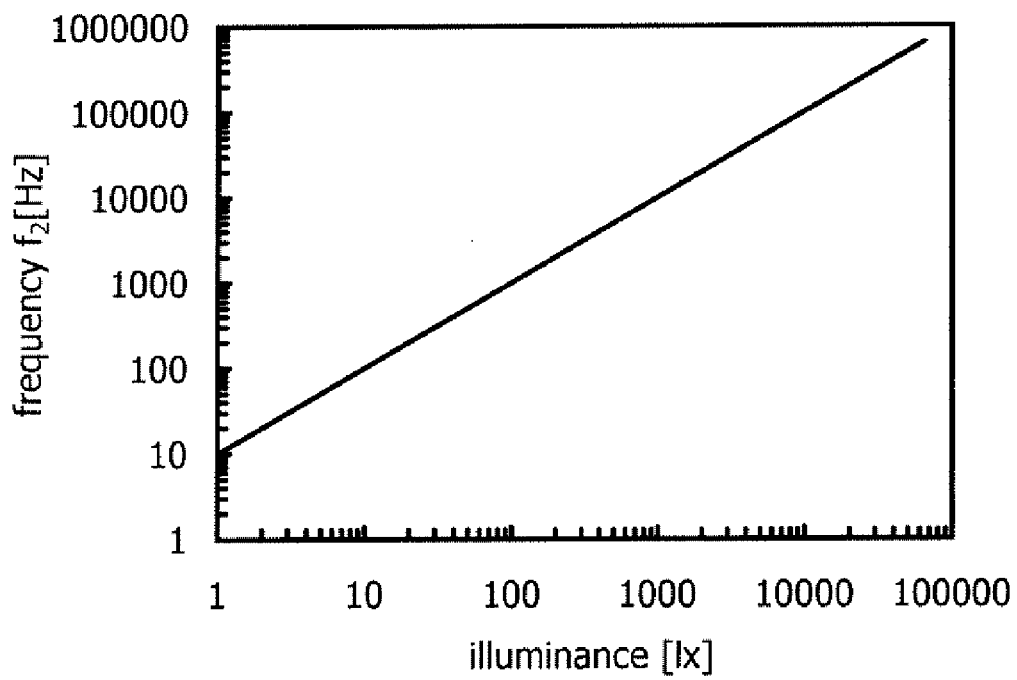
FIG. 5A is a graph of a frequency of a clock signal generated in the variable clock signal generation circuit in FIG. 3 with respect to illuminance.
Figure 5B:
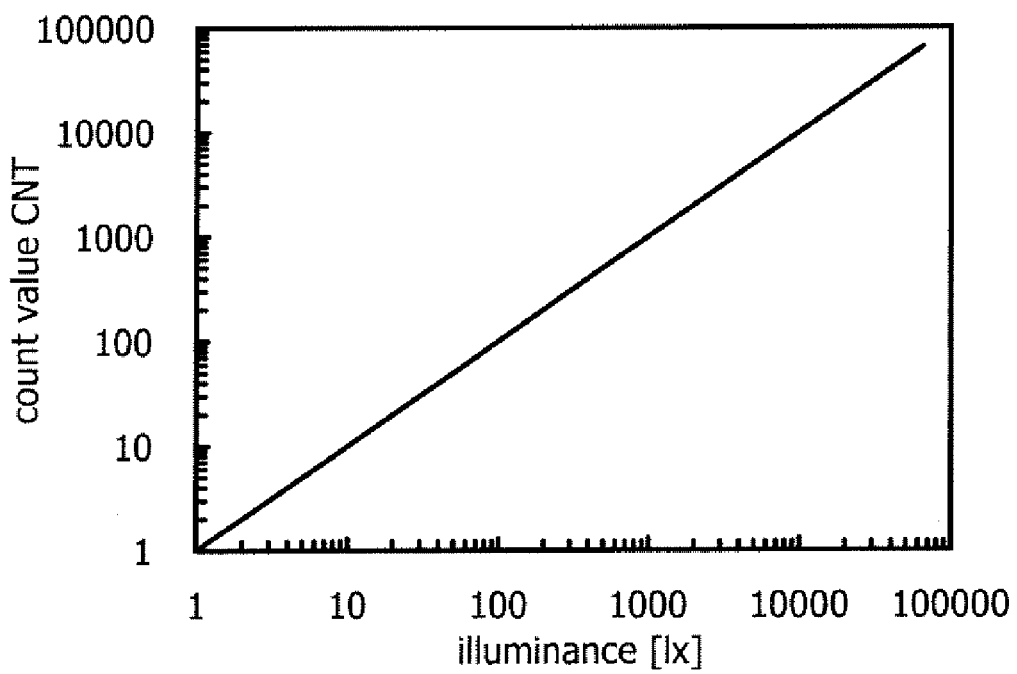
FIG. 5B is a graph of a count value (data of a digital signal generated in a digital signal generation circuit) with respect to illuminance in the case where the circuit in FIG. 3 is applied to a variable clock signal generation circuit.

Output data of the photometric device 10 in this embodiment was calculated. Here, change of the frequency $f_2$ of the clock signal CLK2 with respect to the illuminance of light with which the photodiode 100 is irradiated; and change of the number of pulses (the count value CNT) of the clock signal CLK2, which is counted in a count period $T_{CNT}$ by the count circuit 131, with respect to the illuminance were calculated in the case where the circuit in FIG. 3 is employed as the variable clock signal generation circuit 101 in the photometric device 10. Here, the case where the digital signal generation circuit 103 outputs a 16-bit digital signal was assumed. The calculation results are illustrated in FIGS. 5A and 5B. FIG. 5A is a graph of the frequency $f_2$ of the clock signal CLK2 with respect to the illuminance. FIG. 5B is a graph of the count value CNT with respect to the illuminance. As has been described in Embodiment 1, the count value CNT corresponds to data of the digital signal output from the digital signal generation circuit 103. As illustrated in the graphs of FIGS. 5A and 5B, as the illuminance is increased, the frequency $f_2$ of the clock signal CLK2 is increased and the count value CNT is also increased.

Moreover, the graphs of FIGS. 5A and 5B show that this embodiment can provide a photometric device having a 6-digit (decimal) dynamic range.

Figure 6:
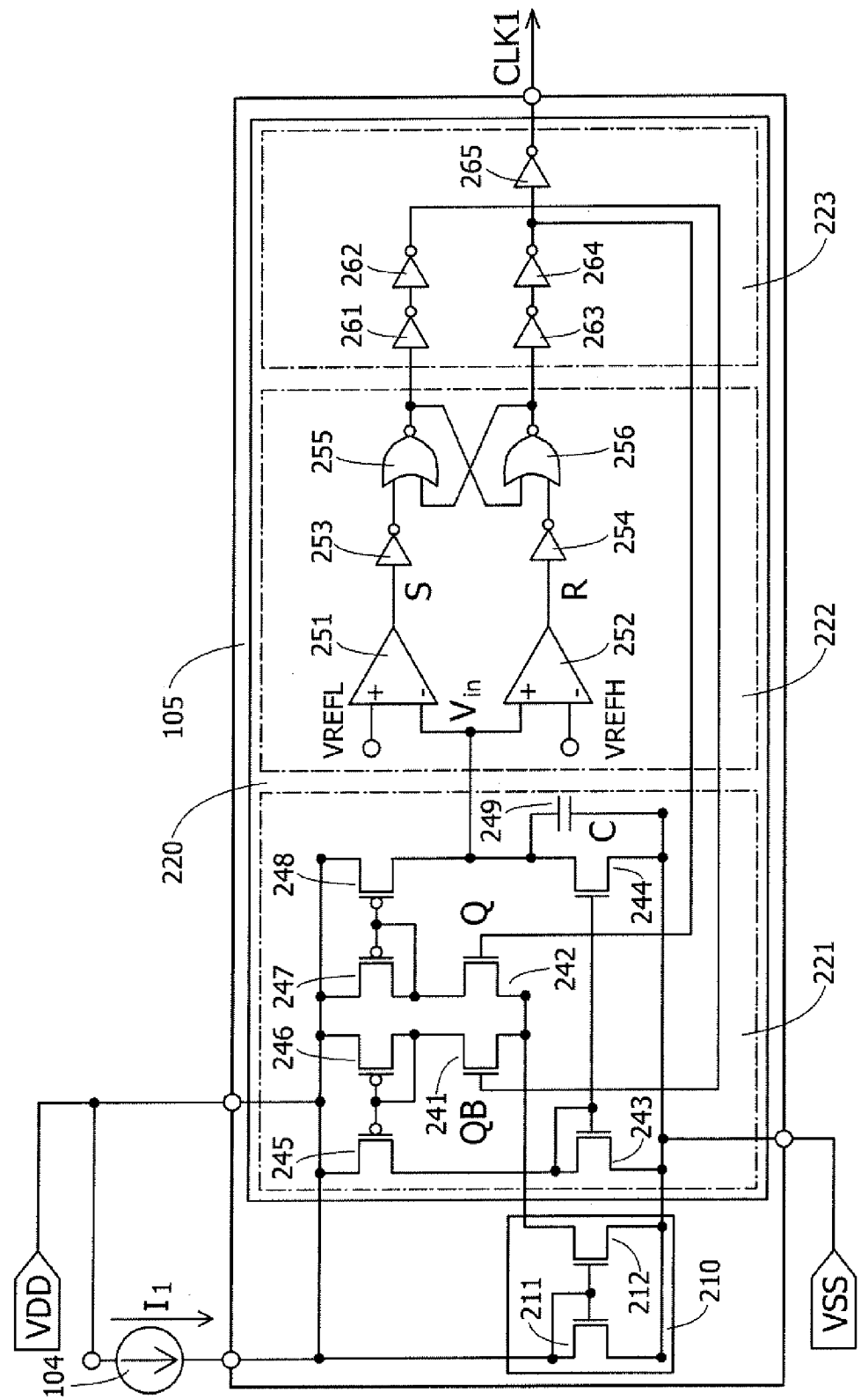
FIG. 6 is a circuit diagram illustrating an example of a structure of a fixed clock signal generation circuit included in the photometric device in FIG. 1.

Next, a structure of the fixed clock signal generation circuit 105 will be described. As the fixed clock signal generation circuit 105, a circuit with the same structure as the variable clock signal generation circuit 101 illustrated in FIG. 3 can be used. It is preferable that the variable clock signal generation circuit 101 and the fixed clock signal generation circuit 105 have the same structure because errors due to variation in electric characteristics of the elements included in the circuits can cancel each other out. FIG. 6 is a circuit diagram of the fixed clock signal generation circuit 105 in that case. The fixed clock signal generation circuit 105 includes a constant current amplifier circuit 210 which amplifies the constant current $I_1$ output from the constant current generation circuit 104, and a clock signal generation circuit 220 which generates a clock signal that oscillates at a frequency proportional to the current amplified by the constant current amplifier circuit 210.

Here, a current mirror formed of transistors 211 and 212 is employed for the constant current amplifier circuit 210. Like the clock signal generation circuit 120, the clock signal generation circuit 220 includes a ramp signal generation circuit 221, a hysteresis comparator circuit 222, and a buffer circuit 223.

Like the ramp signal generation circuit 121, the ramp signal generation circuit 221 includes four n-channel transistors 241 to 244, four p-channel transistors 245 to 248, and a capacitor 249. Like the hysteresis comparator circuit 122, the hysteresis comparator circuit 222 includes two comparators 251 and 252, two inverter circuits 253 and 254, and two NOR circuits 255 and 256. Like the buffer circuit 123, the buffer circuit 223 includes five inverter circuits 261 to 265. An output from the inverter circuit 265 is the clock signal CLK1.

Like the variable clock signal generation circuit 101 in FIG. 3, the fixed clock signal generation circuit 105 in FIG. 6 can generate the clock signal CLK1 which oscillates at the frequency $f_1$ proportional to the constant current $I_1$ generated in the constant current generation circuit 104.

This embodiment can be implemented in combination with other embodiments as appropriate.

Embodiment 3

Figure 7:
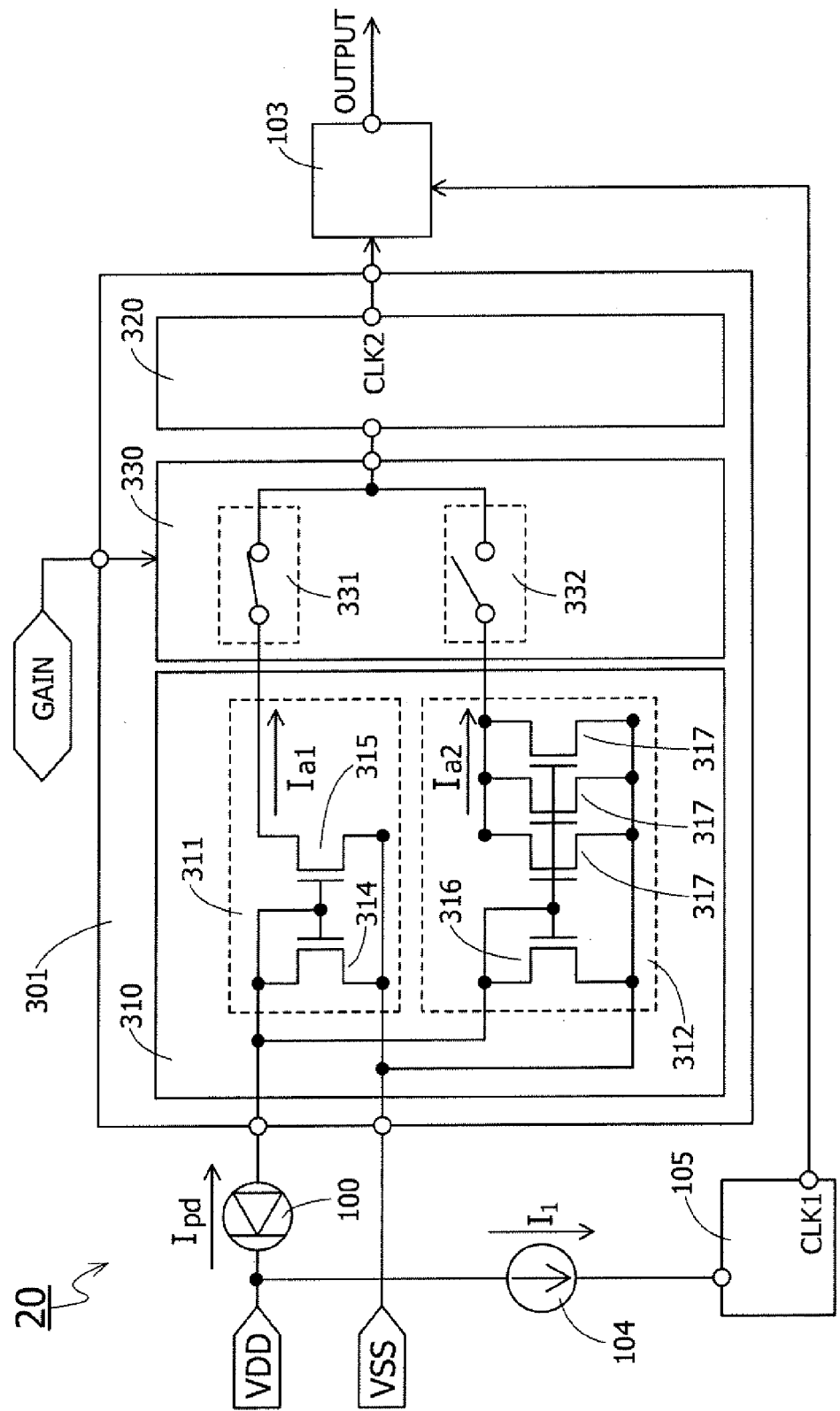
FIG. 7 is a block diagram illustrating an example of a structure of a photometric device having a gain switching function.

In this embodiment a photometric device having a structure different from that in Embodiment 1 will be described. In this embodiment, a structure for improving the resolution of low illuminance light compared to that in the photometric device 10 will be described. FIG. 7 is a block diagram of a photometric device 20 in this embodiment. A variable clock signal generation circuit 301 which has a structure different from that of the variable clock signal generation circuit 101 is employed in the photometric device 20 in this embodiment.

The variable clock signal generation circuit 301 includes a photocurrent amplifier circuit 310 for amplifying the photocurrent Ipd, and a clock signal generation circuit 320 which generates a clock signal that oscillates at a frequency proportional to the amount of current which is to be input.

The photocurrent amplifier circuit 310 is a circuit for amplifying the photocurrent Ipd and includes a plurality of amplifier circuits having different amplification factors. Accordingly, the variable clock signal generation circuit 301 includes a gain switching circuit 330 for selectively inputting one of a plurality of amplified currents generated in the photocurrent amplifier circuit 310 to the clock signal generation circuit 320.

Here, the photocurrent amplifier circuit 310 includes two amplifier circuits 311 and 312. The amplifier circuit 311 is used for detecting light of high illuminance (or of high intensity) and preferably has an amplification factor of one or more. On the other hand, the amplifier circuit 312 is used for detecting light of low illuminance (or of low intensity), and the amplification factor is greater than that of the amplifier circuit 311 and is preferably two or more. In this embodiment, a current mirror circuit is used for both of the amplifier circuits 311 and 312. The amplifier circuit 311 is a current mirror circuit constituted by one transistor 314 for reference and one transistor 315 for amplification. The amplifier circuit 312 is a current mirror circuit constituted by one transistor 316 for reference and three transistors 317 for amplification. When the current mirror circuit is used, the number of transistors 315 in the amplifier circuit 311 for high illuminance can be approximately 1 to 5. Moreover, the number of transistors 317 in the amplifier circuit 312 for low illuminance can be approximately 2 to 50 and is preferably approximately 2 to 10.

The gain switching circuit 330 is provided with a plurality of switch circuits which switch electrical connection states (conduction and non-conduction) between an output of each amplifier circuit and an input of the clock signal generation circuit 320, in accordance with the number of amplifier circuits in the photocurrent amplifier circuit 310. The gain switching circuit 330 makes one switch circuit turned on and the other switch circuits (or the other circuit) turned off in accordance with a gain switching signal GAIN, and thus inputs one amplified current generated in the photocurrent amplifier circuit 310 to the clock signal generation circuit 320.

In this embodiment, the gain switching circuit 330 includes two switch circuits 331 and 332 corresponding to the amplifier circuits 311 and 312, respectively. The gain switching circuit 330 inputs one of current Ia1 amplified by the amplifier circuit 311 and current Ia2 amplified by the amplifier circuit 312 to the clock signal generation circuit 320.

For example, the gain switching signal GAIN can be generated by detecting the amount of photocurrent Ipd or current Ia1. When the photocurrent Ipd (or the current Ia1) is higher than the threshold value, the gain switching signal GAIN for turning on the switch circuit 331 and turning off the switch circuit 332 is generated. On the other hand, when the photocurrent Ipd (or the current Ia1) is lower than the threshold value, the gain switching signal GAIN for turning off the switch circuit 331 and turning on the switch circuit 332 is generated. By controlling the gain switching circuit 330 in such a manner, when the illuminance of light with which the photodiode 100 is irradiated is low (or the amount of light is small), the clock signal generation circuit 320 generates the clock signal CLK2 having a frequency proportional to that of the amplified current Ia2 amplified by the amplifier circuit 312 with a high amplification factor. Accordingly, the resolution on the lower illuminance (lower light intensity) side of the photometric device 20 can be improved.

In this embodiment, the clock signal generation circuit 120 having a structure similar to that in FIG. 3 can be applied to the clock signal generation circuit 320.

In addition, in this embodiment, the fixed clock signal generation circuit 105 having a structure similar to that in FIG. 6 can be applied to the fixed clock signal generation circuit 105. Note that as the constant current amplifier circuit 210, an amplifier circuit having the same structure as one amplifier circuit included in the photocurrent amplifier circuit 110 may be used. For example, the amplifier circuit 311 for high illuminance is used as the constant current amplifier circuit 210.

Embodiment 4

Figure 8:
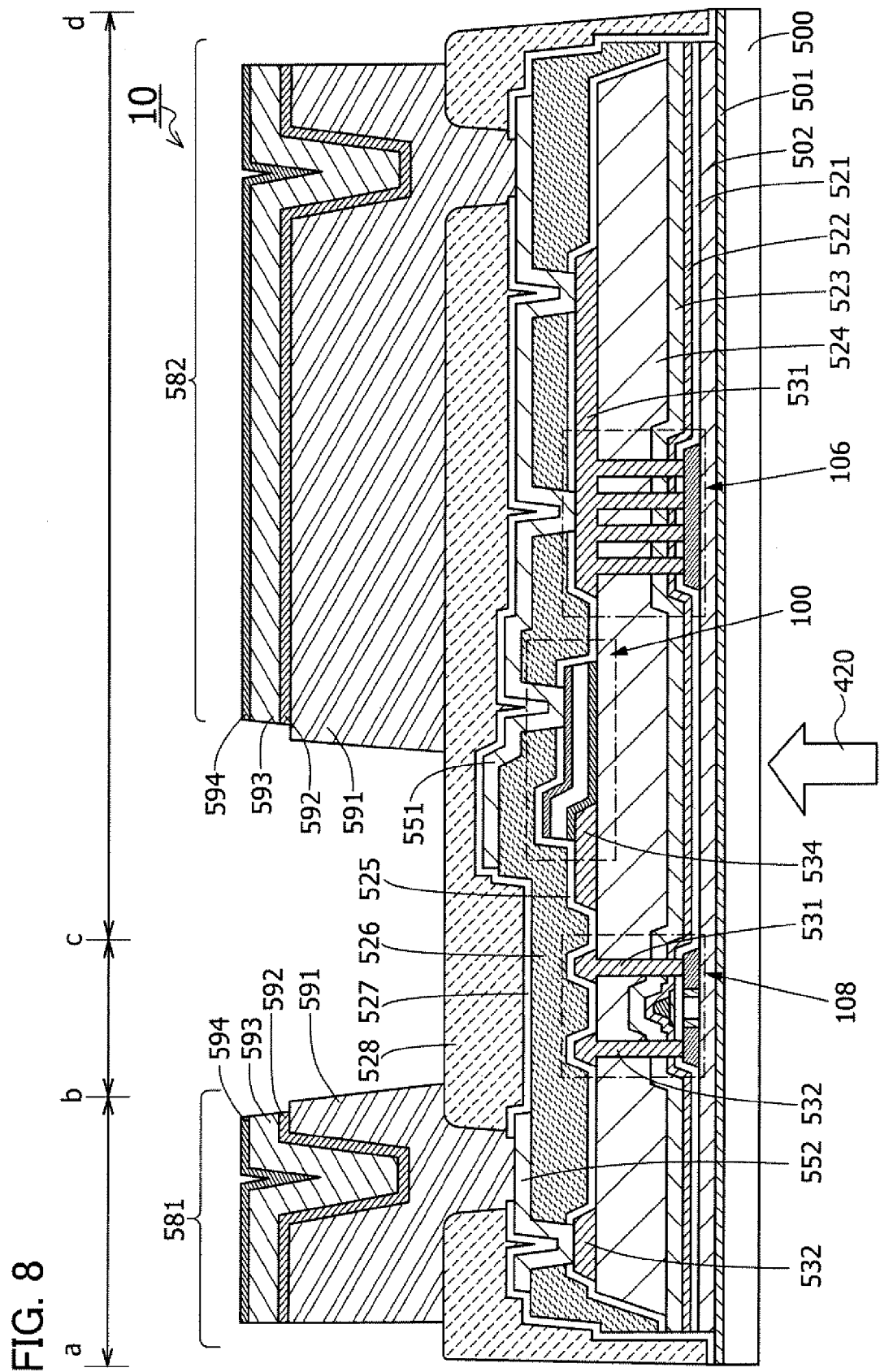
FIG. 8 is a cross-sectional view illustrating an example of a layered structure of the photometric device in FIG. 1.

In this embodiment, an example of a method of manufacturing the photometric device 10 illustrated in FIG. 1 will be described. It is needless to say that the manufacturing method in this embodiment can be applied to a method of manufacturing the photometric device 20. FIG. 8 is a cross-sectional view illustrating a layered structure of the photometric device 10. In this embodiment, a PIN diode 106 is provided between a terminal for the power supply potential VDD and a terminal for the power supply potential VSS to increase the resistance of the photometric device 10 to electrostatic discharge.

Note that FIG. 8 is not a cross-sectional view along a particular section line of the photometric device 10, but a cross-sectional view for illustrating a layered structure of films included in the photometric device 10 and electrical connection between conductive films formed in different layers. In the photometric device 10, the cross-sectional view along the line a-b mainly illustrates an electrical connection structure between second-layer and third-layer conductive films and the power supply terminal for the power supply potential VSS. The cross-sectional view along the line b-c illustrates an n-channel transistor 108 as a typical cross section of a functional circuit in the photometric device 10. The cross-sectional view along the line c-d mainly illustrates an electrical connection structure between the second-layer and third-layer conductive films and the terminal for the power supply potential VDD, and cross-sectional structures of the variable clock signal generation circuit 101 and the PIN diode 106 for a protection circuit.

The PIN diode 106 is provided between a terminal 581 for the power supply potential VSS and a terminal 582 for the power supply potential VDD. A cathode of the PIN diode 106 is electrically connected to the terminal 581, and an anode thereof is electrically connected to the terminal 582. When excessive voltage is applied to the terminal 581 and/or the terminal 582 due to ESD (electrostatic discharge) or the like, the terminal 581 and the terminal 582 are short-circuited by the PIN diode 106 to prevent excessive voltage from being applied to the photodiode 100 and the functional circuit.

Next, a manufacturing method and a cross-sectional structure of the photometric device 10 will be described. First, a manufacturing method of the photometric device 10 will be described. Cross-sectional views of FIGS. 9A to 9E and FIGS. 10A to 10D illustrate the PIN diode 106 and the n-channel transistor 108 included in the functional circuit.

First, a glass substrate 500 is prepared. The glass substrate 500 is preferably a non-alkali glass substrate. Examples of non-alkali glass substrates are an aluminosilicate glass substrate, an aluminoborosilicate glass substrate, and a barium borosilicate glass substrate. Instead of the glass substrate 500, a quartz substrate may be used.

Figure 9A:
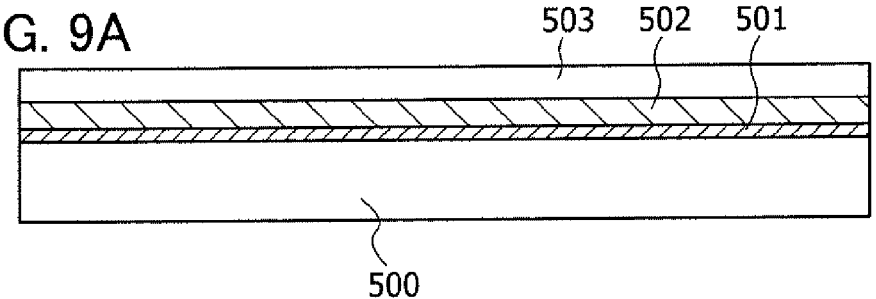
FIGS. 9A to 9E are cross-sectional views illustrating an example of a method of manufacturing the photometric device in FIG. 1.

Next, a base insulating film is formed to a thickness of 50 nm to 300 nm over the glass substrate 500. Here, as illustrated in FIG. 9A, an insulating film having a two-layer structure of a silicon nitride oxide film 501 and a silicon oxynitride film 502 is formed as the base insulating film. Next, a semiconductor film is formed to a thickness of 20 nm to 100 nm over the base insulating film in order to form a semiconductor film in the PIN diode 106 and the transistor 108.

The base insulating film is provided in order to prevent diffusion of alkali metal (typically, Na) and alkaline earth metal contained in the glass substrate 500 so that electric characteristics of a semiconductor element such as a transistor are not adversely affected. The base insulating film may have a single-layer structure or a layered structure and preferably includes at least one barrier film for preventing diffusion of alkali metal and alkaline earth metal. In this embodiment, the silicon nitride oxide film 501 is provided as a barrier film. As the barrier film, a nitride oxide film such as a silicon nitride oxide film, or a nitride film such as a silicon nitride film or an aluminum nitride film is preferably used. In order to decrease the interface state density between the semiconductor film included in the transistor 108 and the base insulating film, the silicon oxynitride film 502 is formed.

In this embodiment, the 140-nm-thick silicon nitride oxide film 501, the 100-nm-thick silicon oxynitride film 502, and a 50-nm-thick amorphous silicon film 503 are successively formed by one PECVD apparatus. The source gas for the silicon nitride oxide film 501 is $SiH_4$, $N_2O$, $NH_3$, and $H_2$. The source gas for the silicon oxynitride film 502 is $SiH_4$ and $N_2O$. The source gas for the amorphous silicon film 503 is $SiH_4$ and $H_2$. By changing the source gases, the three films can be successively formed in one chamber.

In this embodiment, in order to form the PIN diode 106 and the transistor 108 using a crystalline semiconductor film, an amorphous semiconductor film is crystallized to form a crystalline semiconductor film. As a method for crystallizing a semiconductor film, a solid phase epitaxy method using a lamp annealing apparatus or a furnace, a method for crystallizing and melting the semiconductor film by laser light irradiation, or the like can be used.

Figure 9B:
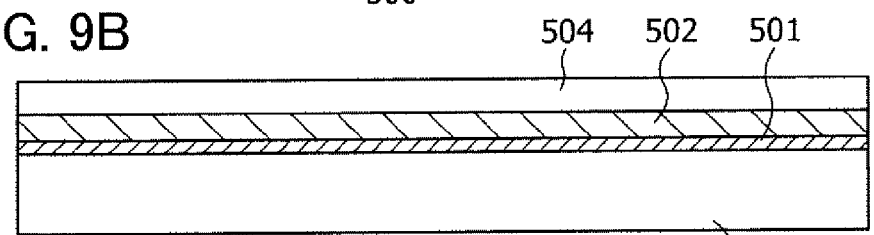

Here, the amorphous silicon film 503 is formed over the base insulating film and subjected to solid phase epitaxy to be crystallized, so that a crystalline silicon film 504 is formed (see FIGS. 9A and 9B). Here, in order to perform the solid phase epitaxy at a heating temperature lower than or equal to 600° C. for a short time, a metal element is added to the amorphous silicon film 503. A method for crystallizing the amorphous silicon film 503 is specifically described below.

First, a surface of the amorphous silicon film 503 is treated with ozone water so that an ultrathin (several-nanometer-thick) oxide film is formed. Thus, the wettability of the surface of the amorphous silicon film 503 is improved. Next, the surface of the amorphous silicon film 503 is coated with a nickel acetate solution containing 10 ppm by weight of nickel by a spinner.

Then, the amorphous silicon film 503 is heated in a furnace so that the crystalline silicon film 504 is formed. For example, in order to crystallize the amorphous silicon film 503, the amorphous silicon film 503 is heated at 500° C. for 1 hour, for example, and then, is heated at 550° C. for 4 hours. With the catalytic action of nickel, the crystalline silicon film 504 can be formed at low temperature for a short time. Further, with the catalytic action of nickel, the crystalline silicon film 504 having few dangling bonds at crystal grain boundaries can be formed. As a metal element which promotes the crystallization of silicon, Fe, Co, Ru, Rh, Pd, Os, Ir, Pt, or the like can be used instead of Ni.

As a method for introducing such a metal element into the amorphous silicon film 503, a method by which a film containing a metal element as its main component is formed on the surface of the amorphous silicon film 503, a method by which a metal element is added to the amorphous silicon film 503 by a plasma doping method, or the like can be used instead of the method by which the amorphous silicon film 503 is coated with a solution of such a metal element.

Next, the crystalline silicon film 504 is irradiated with laser light in order to reduce the crystal defects in the crystalline silicon film 504 and to improve the degree of crystallization. A laser beam having a wavelength of 400 nm or less is preferably used for the laser light. Examples of such laser light are XeCl excimer laser light (XeCl: a wavelength of 308 nm) and the second harmonic or the third harmonic of a YAG laser Before the laser light irradiation, an oxide film formed on a surface of the crystalline silicon film 504 is preferably removed using dilute hydrofluoric acid or the like.

In this embodiment, treatment for gettering of nickel, which is introduced for the crystallization, from the crystalline silicon film 504 is performed for the following reason. Nickel is useful for the crystallization of the amorphous silicon film 503; however, if nickel is included in the crystalline silicon film 504 at high concentration, nickel might be a factor in degrading electric characteristics of the transistor 108, for example, increasing the leakage current of the transistor 108. An example of the gettering treatment is described below.

First, the surface of the crystalline silicon film 504 is treated with ozone water for about 120 seconds, so that an oxide film having a thickness of approximately 1 nm to 10 nm is formed on the surface of the crystalline silicon film 504. Instead of the surface treatment with ozone water, UV light irradiation may be performed. Next, an amorphous silicon film containing Ar is formed to a thickness of approximately 10 nm to 400 nm on the surface of the crystalline silicon film 504 with the oxide film therebetween. The concentration of Ar in the amorphous silicon film is preferably higher than or equal to $1\times10^{18}$ atoms/cm$^3$ and lower than or equal to $1\times10^{22}$ atoms/cm$^3$. Alternatively, another element of Group 18 may be added to the amorphous silicon film instead of Ar.

An element of Group 18 is added to the amorphous silicon film in order to form a gettering site in the amorphous silicon film by generating distortion in the amorphous silicon film. There are two factors which cause the distortion by the addition of the element of Group 18. One is the formation of dangling bonds in crystal by the addition of the element of Group 18. The other is the addition of the element of Group 18 between crystal lattices.

For example, in order to form the amorphous silicon film containing Ar (hereinafter referred to as an Ar:a-Si film) by a PECVD method, SiH$_4$, H$_2$, and Ar are used as a source gas. The flow ratio of SiH$_4$ to Ar (SiH$_4$/Ar) is preferably greater than or equal to 1/999 and less than or equal to 1/9. Further, the process temperature is preferably higher than or equal to 300° C. and lower than or equal to 500° C. The RF power density for exciting the source gas is preferably higher than or equal to 0.0017 W/cm$^2$ and lower than or equal to 0.48 W/cm$^2$. The process pressure is preferably higher than or equal to 1.333 Pa and lower than or equal to 66.65 Pa.

For example, when the Ar:a-Si film is formed by a sputtering method, single crystal silicon is used for a target and Ar is used for a sputtering gas. By performing grow discharge of the Ar gas and sputtering of the single crystal silicon target with Ar ions, an amorphous silicon film containing Ar can be formed. The concentration of Ar in the amorphous silicon film can be controlled in accordance with power, pressure, temperature, or the like for the grow discharge. The process pressure is preferably higher than or equal to 0.1 Pa and lower than or equal to 5 Pa. As the pressure is decreased, the concentration of Ar in the amorphous silicon film can be made higher; therefore, the pressure is preferably lower than or equal to 1.5 Pa. It is not particularly necessary to heat the glass substrate 500 in the process, and the process temperature is preferably lower than or equal to 300° C.

After the Ar:a-Si film is formed, heat treatment at 650° C. for 3 minutes is performed in a furnace for gettering. With this heat treatment, Ni contained in the crystalline silicon film 504 is separated out to the Ar:a-Si film and captured. Accordingly, the concentration of Ni in the crystalline silicon film 504 can be lowered. After the heat treatment is completed, the Ar:a-Si film is removed by etching. In this etching, the oxide film functions as an etching stopper. After the Ar:a-Si film is removed, the oxide film formed on the surface of the crystalline silicon film 504 is removed using dilute hydrofluoric acid or the like. Thus, the crystalline silicon film 504 in which the concentration of Ni is reduced is formed.

Then, an acceptor element is added to the crystalline silicon film 504 so as to control the threshold voltage of the transistor 108. For example, boron is used as the acceptor element and added to the crystalline silicon film 504 at a concentration higher than or equal to $1\times10^{16}$ atoms/cm$^3$ and lower than or equal to $5\times10^{17}$ atoms/cm$^3$.

Figure 9C:
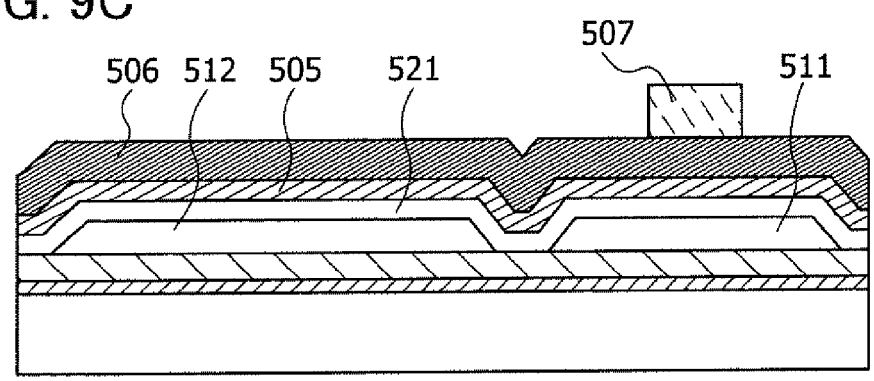

Next, a resist mask is formed over the crystalline silicon film 504. Then, the crystalline silicon film 504 is etched using the resist mask, so that a semiconductor film 511 included in the transistor 108 and a semiconductor film 512 included in the PIN diode 106 are formed as illustrated in FIG. 9C. Moreover, although not illustrated, a semiconductor film included in a p-channel transistor and a semiconductor film included in a capacitor are also formed. In this embodiment, a silicon film is formed as the semiconductor films 511 and 512. Alternatively, a semiconductor film formed of another element of Group 14, such as germanium, silicon germanium, or silicon carbide can be formed as the semiconductor films 511 and 512. Further alternatively, a compound semiconductor film formed of GaAs, InP, SiC, ZnSe, GaN, or SiGe, or an oxide semiconductor film formed of zinc oxide or tin oxide can be used.

Next, as illustrated in FIG. 9C, a gate insulating film is formed over the semiconductor films 511 and 512. Here, as the gate insulating film, a 30-nm-thick silicon oxynitride film 521 is formed. The silicon oxynitride film 521 is formed using SiH$_4$ and N$_2$O as a source gas by a PECVD method.

Then, as a conductive film used for a conductive film 520, a conductive film having a two-layer structure of a 30-nm-thick tantalum nitride film 505 and a 170-nm-thick tungsten film 506 is formed over the silicon oxynitride film 521. The tantalum nitride film 505 and the tungsten film 506 are formed by a sputtering method. Instead of the layered film of the tantalum nitride film 505 and the tungsten film 506, a layered film of a tungsten nitride film and a tungsten film or a layered film of a molybdenum nitride film and a molybdenum film can be formed, for example. In this embodiment, since a source region, a drain region, and a low concentration impurity region are formed in the semiconductor film 511 in a self-aligned manner by using the conductive film 520, the upper-layer conductive film is made smaller than the lower-layer conductive film when viewed from above. Therefore, the etching selectivity of the lower-layer conductive film with respect to the upper-layer conductive film is preferably higher. The layered film of the tantalum nitride film 505 and the tungsten film 506 is preferable in this respect.

Figure 9D:
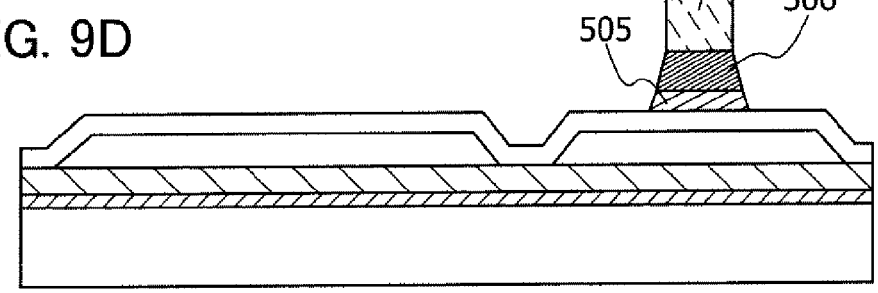

Next, a resist mask 507 is formed over the tungsten film 506. Etching is performed twice using the resist mask 507. First, as illustrated in FIG. 9D, the tantalum nitride film 505 and the tungsten film 506 are etched using the resist mask 507. With this first etching, cross sections of the layered film of the tantalum nitride film 505 and the tungsten film 506 are tapered. For example, this etching can be performed using a mixture gas of CF$_4$, Cl$_2$, and O$_2$ as an etching gas by an inductively coupled plasma (ICP) etching apparatus.

Figure 9E:
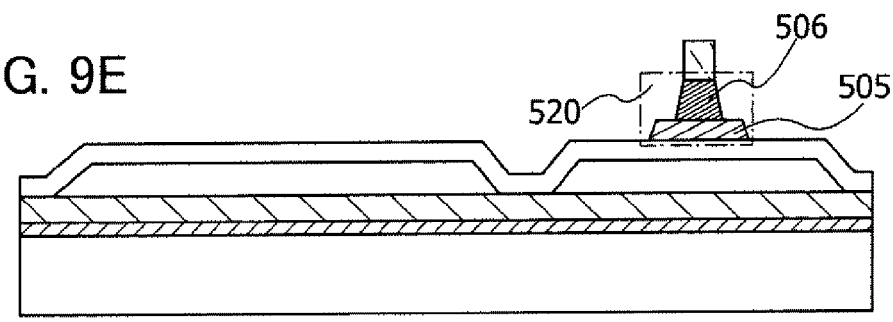

Further, as illustrated in FIG. 9E, the upper-layer tungsten film 506 is selectively etched using the resist mask 507. This etching is anisotropic etching and can be performed using a mixture gas of Cl$_2$, SF$_6$, and O$_2$ as an etching gas by an ICP etching apparatus. By performing etching twice, the first-layer conductive film 520 is formed. In the conductive film 520, end portions of the tungsten film 506 are on a top surface of the tantalum nitride film 505, and the tungsten film 506 is smaller than the tantalum nitride film 505 when viewed from above.

After the resist mask 507 is removed, a resist mask 508 is formed so as to cover a region to be a high-resistance region and a region to be a p-type impurity region, which are in the semiconductor film 512. Then, a donor element is added to the semiconductor films 511 and 512 so that an n-type impurity region is formed. Here, phosphorus is added as the donor element. First, in order to form an n-type low concentration impurity region in the semiconductor film 511, phosphorus is added to the semiconductor films 511 and 512 under conditions of low dosage and high accelerating voltage. $PH_3$ can be used as a source gas for phosphorus. Under these conditions, only part of the conductive film 520, where the tantalum nitride film 505 and the tungsten film 506 are stacked, functions as a mask, and phosphorus passes through a portion of the conductive film 520, where only the tantalum nitride film 505 is formed, whereby a low concentration impurity region 560 and a low concentration impurity region 561 are formed in the semiconductor film 511. Further, a low concentration impurity region 562 is formed in the semiconductor film 512.

Figure 10A:
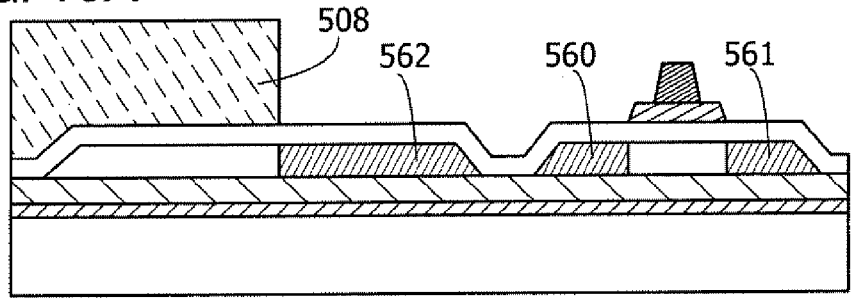
FIGS. 10A to 10D are cross-sectional views illustrating an example of steps after the step in FIG. 9E.
Figure 10B:
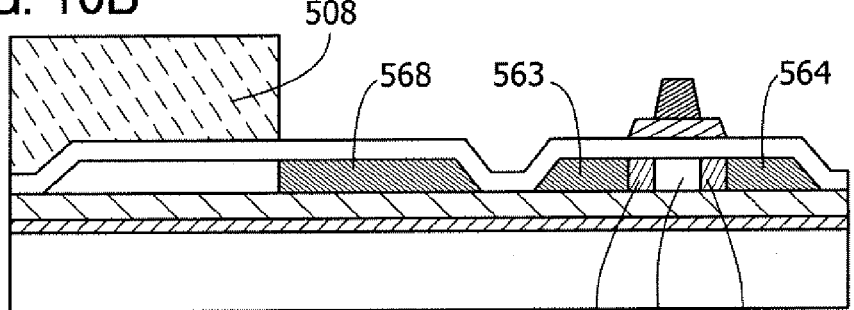
Figure 10C:
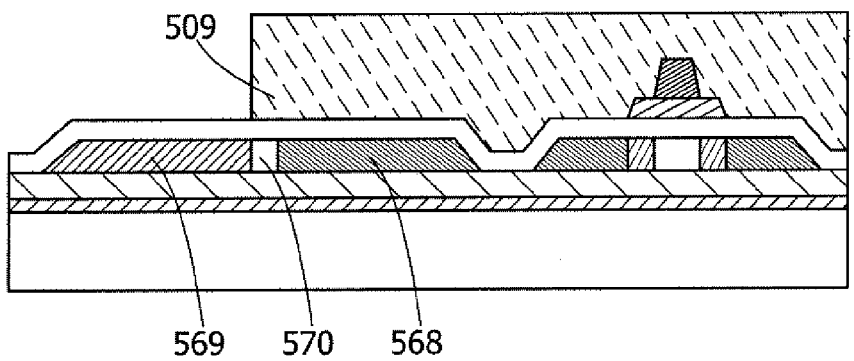
Figure 10D:
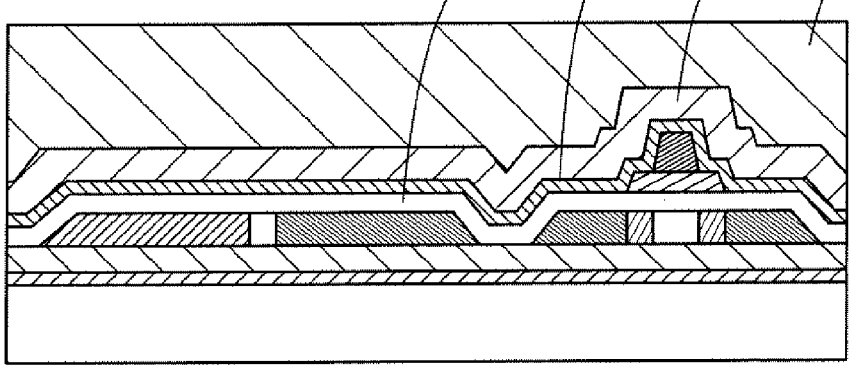

Next, in order to form a source region and a drain region, phosphorus is added under conditions of high dosage and low accelerating voltage. Under these conditions, the entire conductive film 520 functions as a mask, and a drain region 563 and a source region 564 are formed in the semiconductor film 511 in a self-aligned manner, as illustrated in FIG. 10B. Further, a low concentration impurity region 565, a low concentration impurity region 566, and a channel formation region 567 are also formed in the semiconductor film 511 in a self-aligned manner. Moreover, an n-type impurity region 568 is formed in the semiconductor film 512.

After the resist mask 508 is removed, a resist mask 509 is formed so as to cover the entire semiconductor film 511 and a region to be a high-resistance region and a region to be an n-type impurity region, which are in the semiconductor film 512. Next, an acceptor element is added to the semiconductor film 512 to form a p-type impurity region. Here, boron is added as the acceptor element. $B_2H_6$ can be used as a source gas for boron. By the addition of boron under conditions of high dosage and low accelerating voltage, a p-type impurity region 569 is formed in the semiconductor film 512. Further, a region to which the donor element and the acceptor elements are not added in the step of adding impurity elements in FIGS. 10A to 10C serves as a high-resistance region 570. Moreover, in this step, a source region and a drain region are formed in the semiconductor film in the p-channel transistor.

After the resist mask 509 is removed, a first-layer interlayer insulating film is formed over the glass substrate 500 so as to cover the conductive film 520. In this embodiment, the interlayer insulating film has a three-layer structure. A first layer is a 30-nm-thick silicon oxynitride film 522. A second layer is a 165-nm-thick silicon nitride oxide film 523. A third layer is a 600-nm-thick silicon oxynitride film 524. These films 522 to 524 are formed by a PECVD apparatus.

First, the silicon oxynitride film 522 is formed using $SiH_4$ and $N_2O$ as a source gas. Then, heat treatment is performed so that phosphorus and boron which are added to the semiconductor films 511 and 512 are activated. After the heat treatment is completed, the silicon nitride oxide film 523 and the silicon oxynitride film 524 are formed by a PECVD apparatus. $SiH_4$, $N_2O$, $NH_3$, and $H_2$ are used as a source gas for the silicon nitride oxide film 523 so that the concentration of hydrogen in the silicon nitride oxide film 523 is high. $SiH_4$ and $N_2O$ are used as a source gas for the silicon oxynitride film 524. After the silicon oxynitride film 524 is formed, heat treatment is performed so that hydrogen in the silicon nitride oxide film 523 is dispersed, whereby dangling bonds in the semiconductor films 511 and 512 are terminated with hydrogen. This heat treatment can be performed at a temperature of 300° C. to 550° C.

The subsequent steps will be described with reference to cross-sectional views of FIGS. 11A to 11C, FIGS. 12A and 12B, FIGS. 13A and 13B, and FIG. 14. Cross-sectional structures in FIGS. 11A to 11C, FIGS. 12A and 12B, FIGS. 13A and 13B, and FIG. 14 are illustrated in a manner similar to that of FIG. 8.

The layered film including the silicon oxynitride film 521, the silicon oxynitride film 522, the silicon nitride oxide film 523, and the silicon oxynitride film 524 is etched using a resist mask so that a plurality of openings are formed. The openings form a portion where the semiconductor film included in the element and a second-layer conductive film are electrically connected to each other, and a portion where the first-layer conductive film and the second-layer conductive film are electrically connected to each other. For example, the openings are formed in a connection portion between a conductive film 531 and the drain region 563 in the semiconductor film 511, a connection portion between a conductive film 532 and the source region 564 in the semiconductor film S11, a connection portion between a conductive film 533 and the conductive film 520, a connection portion between a conductive film 534 and the conductive film 520, a connection portion between the conductive film 531 and the n-type impurity region 568 in the semiconductor film 512, and a connection portion between the conductive film 532 and the p-type impurity region 569 in the semiconductor film 512.

Next, a conductive film used for the second-layer conductive film is formed over the silicon oxynitride film 524. Here, a 400-nm-thick titanium film is formed by a sputtering method. A resist mask is formed over the titanium film, and the titanium film is etched using the resist mask to form the second-layer conductive film. FIG. 11A illustrates the conductive films 531 to 534. Here, the conductive film 532 serves as a wiring for electrically connecting the terminal for the power supply potential VSS and the functional circuit in the photometric device 10. The conductive film 534 serves as a wiring (or an electrode) for electrically connecting the photodiode 100 and the variable clock signal generation circuit 101.

Note that each of the second-layer conductive films 531 to 534 and third-layer conductive films 551 and 552 is preferably a film formed of titanium, a titanium alloy, a titanium compound, molybdenum, a molybdenum alloy, or a molybdenum compound. The film formed using such a conductive material has advantages in that heat resistance is high, electrolytic corrosion due to contact with a silicon film does not easily occur, and migration does not easily occur.

Next, as illustrated in FIG. 11A, a photoelectric conversion layer 540 included in the photodiode 100 is formed over the silicon oxynitride film 524. Here, as the photoelectric conversion layer 540, an amorphous silicon film is formed by a PECVD apparatus. In order to provide a PIN junction in the photoelectric conversion layer 540, the photoelectric conversion layer 540 has a three-layer structure of a layer having n-type conductivity, a layer having i-type conductivity, and a layer having n-type conductivity. Note that the photoelectric conversion layer 540 is not limited to the amorphous silicon film and may be a microcrystalline silicon film or a single crystalline silicon film.

First, a 60-nm-thick p-type amorphous silicon film 541, a 400-nm-thick i-type amorphous silicon film 542, and an 80-nm-thick n-type amorphous silicon film 543 are successively formed by a PECVD apparatus so as to cover the conductive films 531 to 534. $SiH_4$, $H_2$, and $B_2H_6$ are used as a source gas for the p-type amorphous silicon film 541 to add boron. $SiH_4$ and $H_2$ are used as a source gas for the i-type amorphous silicon film 542 to form an amorphous silicon film to which an impurity element which serves as a donor or an acceptor is not intentionally added. $SiH_4$, $H_2$, and $PH_3$ are used as a source gas for the n-type amorphous silicon film 543 to add phosphorus. Then, the layered film of the amorphous silicon films 541 to 543 is etched using a resist mask to form the photoelectric conversion layer 540.

Here, a plurality of photometric devices 10 are simultaneously formed over one glass substrate 500. After the photometric devices 10 are completed, the glass substrate 500 is cut in accordance with the size of the photometric device 10 so that the photometric devices 10 are separated into individual devices. Here, in order to well protect side surfaces of the photometric device 10 separated, the silicon oxynitride film 524 formed in a peripheral portion 545 (a portion indicated by dotted lines) of the photometric device 10 is removed as illustrated in FIG. 11B. This step can be performed by etching.

Next, a second-layer interlayer insulating film is formed so as to cover the silicon nitride oxide film 523, the silicon oxynitride film 524, the conductive films 531 to 534, and the photoelectric conversion layer 540. Here, as illustrated in FIG. 11C, a two-layer insulating film of a 100-nm-thick silicon nitride oxide film 525 and an 800-nm-thick silicon oxide film 526 is formed.

The silicon nitride oxide film 525 is formed by a PECVD apparatus using $SiH_4$, $N_2O$, $NH_3$, and $H_2$ as a source gas. The silicon nitride oxide film 525 functions as a passivation film. Instead of the silicon nitride oxide film 525, a silicon nitride film may be formed. The silicon nitride film can be formed by a PECVD apparatus using $SiH_4$, $NH_3$, and $H_2$ as a source gas. Further, the silicon oxide film 526 is formed by a PECVD apparatus using $O_2$ and tetraethoxysilane (TEOS: $Si(OC_2H_5)_4$) as a source gas. Instead of the silicon oxide film 526, a silicon oxynitride film may be formed by a PECVD apparatus.

Next, the layered film of the silicon nitride oxide film 525 and the silicon oxide film 526 is etched using a resist mask, so that openings which serve as contact holes are formed.

Then, a conductive film used for the third-layer conductive film is formed over the silicon oxide film 526. Here, a 200-nm-thick titanium film is formed by a sputtering method. A resist mask is formed over the titanium film, and the titanium film is etched using the mask to form the third-layer conductive film. FIG. 12A illustrates the conductive films 551 and 552.

Next, as illustrated in FIG. 12B, the insulating films (502 and 521 to 526) other than the silicon nitride oxide film 501 are removed from a peripheral portion 546 (a portion indicated by dotted lines) of the photometric device 10. This step can be performed by etching. The insulating films are removed from the peripheral portion of the photometric device 10 in this manner in order to well protect the side surfaces of the photometric device 10 divided, in a manner similar to the case of removing the silicon oxynitride film 524 in the step of FIG. 11B.

Figure 13A:
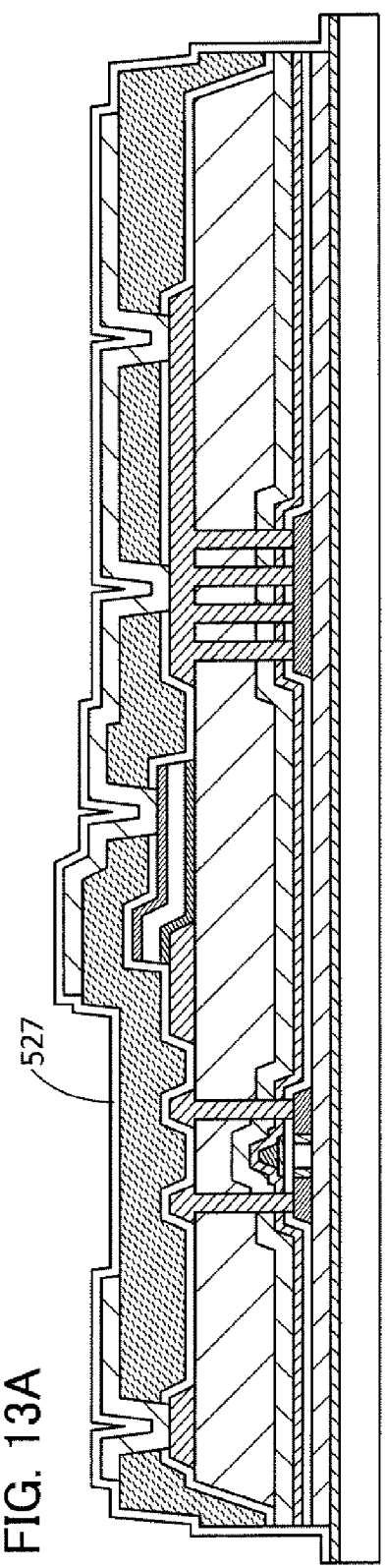
FIGS. 13A and 13B are cross-sectional views illustrating an example of steps after the step in FIG. 12B.

Then, as illustrated in FIG. 13A, a 100-nm-thick silicon nitride oxide film 527 is formed. The silicon nitride oxide film 527 is formed by a PECVD apparatus using $SiH_4$, $N_2O$, $NH_3$, and $H_2$ as a source gas. The silicon nitride oxide film 527 functions as a passivation film. A surface where the third-layer conductive films 551 and 552 and all the insulating films (501, 503, and 521 to 526) are exposed is covered with the silicon nitride oxide film 527. Therefore, for the photodiode 100 and the functional circuits in the photometric device 10, the glass substrate 500 side is protected with the silicon nitride oxide film 501 which serves as the barrier layer, and the side where the power supply terminals 581 and 582 are formed is protected with the silicon nitride oxide film 527. Such a structure can prevent moisture or impurities such as an organic substance from entering the photometric device 10.

Figure 13B:
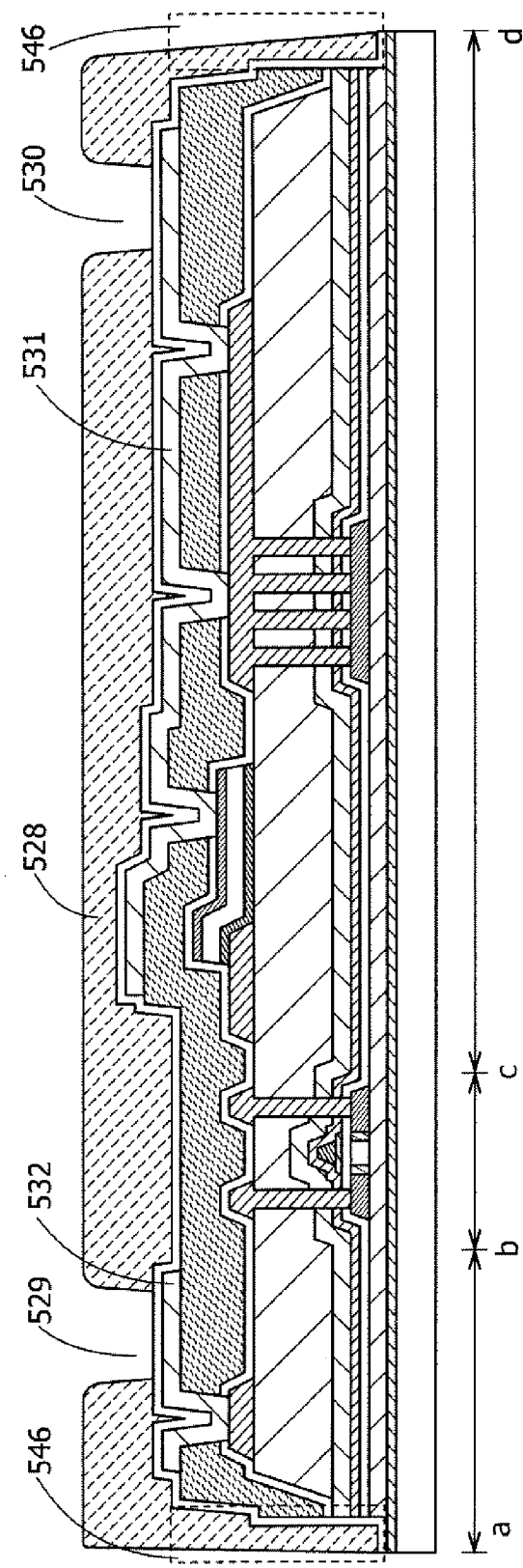

Next, as illustrated in FIG. 13B, a sealing film 528 is formed. The top surface and the side surfaces of the integrated circuit portion are sealed with the sealing film 528. The thickness of the sealing film 528 is preferably 1 μm or more, and is approximately 1 μm to 30 μm. The sealing film 528 is preferably formed using a resin film so as to be formed thick as described above. Here, by forming a photosensitive epoxy-phenol-based resin film by a printing method, the sealing film 528 having openings in portions to be connected to an input terminal and/or an output terminal of the photometric device 10 is formed. An opening 529 and an opening 530 illustrated in FIG. 13B form a portion to be connected to the terminal for the power supply potential VSS and a portion to be connected to the terminal for the power supply potential VDD, respectively.

Figure 14:
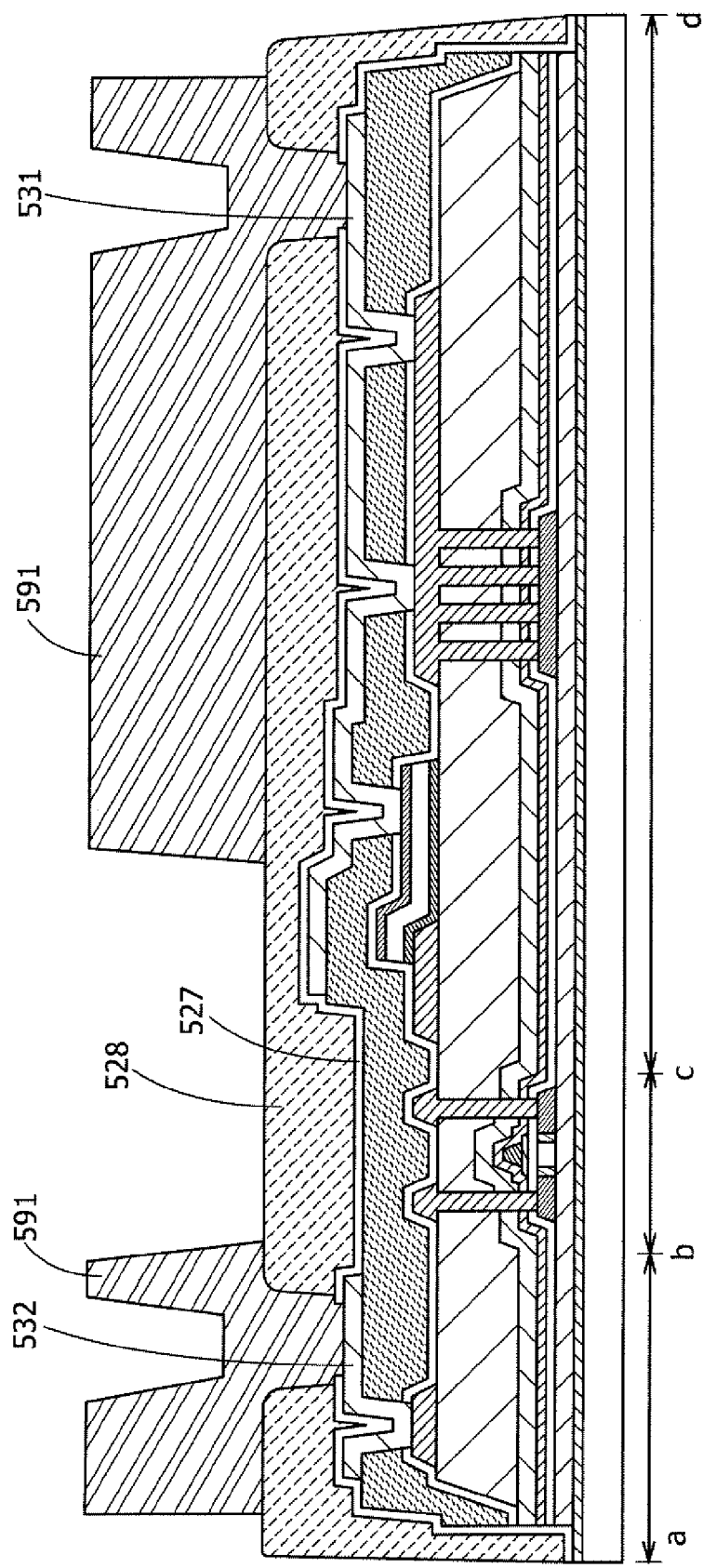
FIG. 14 is a cross-sectional view illustrating an example of a step after the step in FIG. 13B.

Then, the silicon nitride oxide film 527 is etched using a resist mask, so that the silicon nitride oxide film 527 inside the opening formed in the sealing film 528 is removed (see FIG. 14).

Next, the input and/or output terminal of the photometric device 10 is formed over the sealing film 528. Here, although a method of forming the terminal 581 for the power supply potential VSS and the terminal 582 for the power supply potential VDD is described, other terminals are similarly formed. In this embodiment, the terminals 581 and 582 are formed using a four-layer conductive film. First, first-layer conductive films 591 and 592 are formed by a printing method such as a screen printing method. In this embodiment, the conductive films 591 and 592 are formed to a thickness of approximately 15 μm by a screen printing method using a conductive paste containing nickel particles.

A conductive paste refers to a material in which metal particles or metal powders are dispersed into a binder formed using a resin. By solidifying such a conductive paste, a conductive resin film is formed. Therefore, since the conductive film 591 is formed using a conductive resin film, the adhesion of the conductive film 591 to a solder is weak. Accordingly, in order to improve the adhesion of the power supply terminals 581 and 582 to a solder, a conductive film having a predetermined shape is formed on the top surface of the conductive film 591 by a sputtering method using a metal mask. Here, as illustrated in FIG. 8, a three-layer conductive film is formed over the conductive film 591. A first-layer conductive film is a titanium film 592 having a thickness of 150 nm; a second-layer conductive film is a nickel film 593 having a thickness of 750 nm; and a third-layer conductive film is an Au film 594 having a thickness of 50 nm. Through the above steps, the terminals 581 and 582 each having a four-layer structure are completed.

Next, the glass substrate 500 is cut so that the photometric devices 10 are separated into individual devices in the peripheral portion 546 of the photometric device 10 (in the portions indicated by the dotted lines in FIG. 12B). The glass substrate 500 can be cut by dicing, laser cutting, or the like. Before the glass substrate 500 is divided, the glass substrate 500 can be made thinner by polishing or grinding a rear surface of the glass substrate 500. This step is preferably performed before the conductive films (593 to 598) are formed by a sputtering method. By making the glass substrate 500 thinner, wearing out of a cutting tool used for cutting the glass substrate 500 can be reduced. Further, by making the glass substrate 500 thinner, the photometric device 10 can be made thinner. For example, the glass substrate 500 having a thickness of approximately 0.5 mm can be thinned to a thickness of approximately 0.25 mm. When the glass substrate 500 is made thinner, the rear surface and the side surfaces of the glass substrate 500 are preferably covered with a resin film so that the glass substrate 500 is protected.

Through the above steps, the photometric device 10 is completed. Note that although a method of forming the functional circuit using transistors having an SOI structure is described in this embodiment, the photometric device 10 can be formed using a bulk semiconductor substrate such as a single crystal silicon substrate.

Embodiment 5

In Embodiment 4, the method of manufacturing the functional circuit using a crystalline semiconductor film formed by crystallizing an amorphous semiconductor film is described. The functional circuit can be formed using a single semiconductor film formed over a glass substrate. In this embodiment, a method of forming a semiconductor substrate with an SOI structure, to which a single crystal semiconductor film is fixed, will be described.

As illustrated in FIG. 15A, a glass substrate 800 is prepared. The glass substrate 800 is a support substrate which supports a single crystal semiconductor layer separated from a single crystal semiconductor substrate. As the glass substrate 800, a substrate having a coefficient of thermal expansion ranging from $25 \times 10^{-7}/°$ C. to $50 \times 10^{-7}/°$ C. (preferably from $30 \times 10^{-7}/°$ C. to $40 \times 10^{-7}/°$ C.) and a strain point ranging from 580° C. to 680° C. (preferably from 600° C. to 680° C.) is preferably used. Moreover, the glass substrate is preferably a non-alkali glass substrate in order to suppress contamination of the functional circuit. Examples of non-alkali glass substrates are an aluminosilicate glass substrate, an aluminoborosilicate glass substrate, and a barium borosilicate glass substrate.

Alternatively, instead of the glass substrate 800, an insulating substrate such as a ceramic substrate, a quartz substrate, or a sapphire substrate; a conductive substrate such as a metal substrate or a stainless steel substrate; a semiconductor substrate formed of silicon, gallium arsenide, or the like; or the like can be used.

As illustrated in FIG. 15B, a single crystal semiconductor substrate 801 is prepared. A semiconductor layer separated from the single crystal semiconductor substrate 801 is attached to the glass substrate 800, whereby an SOI substrate is formed. As the single crystal semiconductor substrate 801, a single crystal semiconductor substrate including an element belonging to Group 14, such as silicon, germanium, silicon germanium, or silicon carbide can be used. In this embodiment, the glass substrate 800 is larger in size than the single crystal semiconductor substrate 801.

As illustrated in FIG. 15C, an insulating film 802 is formed over the single crystal semiconductor substrate 801. The insulating film 802 can have a single-layer structure or a layered structure. The thickness of the insulating film 802 can be in the range from 5 nm to 400 nm. As a film included in the insulating film 802, an insulating film containing silicon or germanium such as silicon oxide, silicon nitride, silicon oxynitride, silicon nitride oxide, germanium oxide, germanium nitride, germanium oxynitride, or germanium nitride oxide can be used. Alternatively, an insulating film containing metal oxide such as aluminum oxide, tantalum oxide, or hafnium oxide; an insulating film containing metal nitride such as aluminum nitride; an insulating film containing metal oxynitride such as aluminum oxynitride; or an insulating film containing metal nitride oxide such as aluminum nitride oxide can be used. The insulating film included in the insulating film 802 can be formed by a CVD method, a sputtering method, or a method of oxidizing or nitriding the single crystal semiconductor substrate 801, for example.

Further, the insulating film preferably includes a film for preventing impurities from the glass substrate 800 from being diffused into a single crystal semiconductor film. Examples of such a film are a silicon nitride film, a silicon nitride oxide film, an aluminum nitride film, and an aluminum nitride oxide film. When such a film is included, the insulating film 802 can function as a barrier layer.

When the insulating film 802 is formed as a single-layer barrier layer, the insulating film 802 can be a silicon nitride film, a silicon nitride oxide film, an aluminum nitride film, or an aluminum nitride oxide film which has a thickness of 5 nm to 200 nm.

When the insulating film 802 is a two-layer film functioning as a barrier layer, the upper layer is an insulating film with a high barrier property. As such an insulating film, a silicon nitride film, a silicon nitride oxide film, an aluminum nitride film, an aluminum nitride oxide film, or the like which has a thickness of 5 nm to 200 nm can be formed. These films have high blocking effect for preventing impurity diffusion but have high internal stress. Therefore, as the lower insulating film that is in contact with the single crystal semiconductor substrate 801, it is preferable to use a film that has effect of alleviating the stress of the upper insulating film. Examples of such an insulating film are a silicon oxide film, a silicon oxynitride film, and a thermal oxide film obtained by thermally oxidizing the single crystal semiconductor substrate 801. Such an insulating film can be formed to a thickness of 5 nm to 300 nm.

In this embodiment the insulating film 802 has a two-layer structure of an insulating film 802*a* and an insulating film 802*b*. As the insulating film 802*a*, a 100-nm-thick silicon oxynitride film is formed using $SiH_4$ and $N_2O$ as a source gas by a PECVD method. As the insulating film 802*b*, a 50-nm-thick silicon nitride oxide film is formed using $SiH_4$, $N_2O$, and $NH_3$ as a source gas by a PECVD method.

Next, as illustrated in FIG. 15D, the single crystal semiconductor substrate 801 is irradiated with an ion beam 805 including ions accelerated by an electric field through the insulating film 802, so that a weakened layer 803 is formed in a region at a predetermined depth from the surface of the single crystal semiconductor substrate 801. In this ion irradiation step, the single crystal semiconductor substrate 801 is irradiated with the ion beam 805 including accelerated ion species so that an element included in the ion species is added to the single crystal semiconductor substrate 801. When the ion beam 805 is emitted to the single crystal semiconductor substrate 801, a layer whose crystal structure is weakened by impact of the accelerated ion species is formed at a predetermined depth in the single crystal semiconductor substrate 801, which is the weakened layer 803. The depth of the region where the weakened layer 803 is formed can be controlled by the acceleration energy of the ion beam 805 and the angle at which the ion beam 805 enters. The acceleration energy can be adjusted by accelerating voltage, dosage, or the like. The weakened layer 803 is formed at substantially the same depth as the average depth at which the ions enter. That is, the thickness of a semiconductor layer to be separated from the single crystal semiconductor substrate 801 is determined based on the depth at which the ions enter. The depth at which the weakened layer 803 is formed is greater than or equal to 50 nm and less than or equal to 500 nm, and preferably greater than or equal to 50 nm and less than or equal to 200 nm.

In order to irradiate the semiconductor substrate 801 with the ion beam 805, an ion doping method in which mass separation is not performed can be employed as an alternative to an ion implantation method in which mass separation is performed.

When hydrogen ($H_2$) is used for a source gas, $H^+$, $H_2^+$, and $H_3^+$ can be produced by exciting a hydrogen gas. Ion species produced from the source gas and their proportion can be changed by adjusting a plasma excitation method, pressure in an atmosphere for generating plasma, the amount of supplying the source gas, and the like. When the weakened layer 803 is formed by an ion doping method, it is preferable that $H_3^+$ be contained at 70% or more with respect to the total amount of $H^+$, $H_2^+$, and $H_3^+$ in the ion beam 805, and it is more preferable that the proportion of $H_3^+$ be 80% or more. This is because the accelerating voltage of ions needs to be low in order to form the weakened layer 803 in a shallow region, and when the proportion of $H_3^+$ ions in plasma generated by exciting a hydrogen gas is high, atomic hydrogen can be efficiently added to the single crystal semiconductor substrate 801.

When ion irradiation is performed by an ion doping method using a hydrogen gas, the accelerating voltage can be set to be greater than or equal to 10 kV and less than or equal to 200 kV and the dosage can be set to be greater than or equal to $1 \times 10^{16}$ ions/cm$^2$ and less than or equal to $6 \times 10^{16}$ ions/cm$^2$. By irradiation with the hydrogen ions under these conditions, the weakened layer 803 can be formed in a region at a depth from 50 nm to 500 nm in the single crystal semiconductor substrate 801, although it depends on the ion species included in the ion beam 805 and their proportion.

For example, in the case where the single crystal semiconductor substrate 801 is a single crystal silicon substrate, the insulating film 802a is a 50-nm-thick silicon oxynitride film, and the insulating film 802b is a 50-nm-thick silicon nitride oxide film, a semiconductor layer with a thickness of approximately 120 nm can be separated from the single crystal semiconductor substrate 801 under the following conditions: a source gas is hydrogen, the accelerating voltage is 40 kV, and the dosage is $2 \times 10^{16}$ ions/cm$^2$. Alternatively, when the irradiation with the hydrogen ions is performed under the above conditions except that the insulating film 802a is a 100 nm-thick silicon oxynitride film, a semiconductor layer with a thickness of approximately 70 nm can be separated from the single crystal semiconductor substrate 801.

As the source gas in the ion irradiation step, helium (He) or a halogen gas such as a fluorine gas (a Cl$_2$ gas) or a chlorine gas (a F$_2$ gas) can be used instead of a hydrogen gas.

After the weakened layer 803 is formed, an insulating film 804 is formed on the top surface of the insulating film 802 as illustrated in FIG. 15E. In a step for forming the insulating film 804, the heating temperature of the single crystal semiconductor substrate 801 is set at a temperature at which the element or the molecule which is added to the weakened layer 803 is not precipitated, and the heating temperature is preferably 350° C. or lower. In other words, the heat treatment is performed at a temperature at which the gas is not released from the weakened layer 803. Alternatively, the insulating film 804 can be formed before the ion irradiation step is performed. In that case, the process temperature for forming the insulating film 804 can be set at 350° C. or higher.

The insulating film 804 is a film for forming a smooth hydrophilic bonding surface on the single crystal semiconductor substrate 801. The insulating film 804 preferably has a thickness of 5 nm to 500 nm, and more preferably 10 nm to 200 nm. As the insulating film 804, a silicon oxide film or a silicon oxynitride film can be formed. Here, a 50-nm-thick silicon oxide film is formed by a PECVD method using TEOS and O$_2$ as a source gas.

Note that one of the insulating films 802 and 804 is not necessarily formed. Moreover, an insulating film having a single-layer structure or a layered structure may be formed over the glass substrate 800. This insulating film can be formed in a manner similar to that of the insulating film 802. When the insulating film has a layered structure, an insulating film which serves as a barrier layer is preferably formed in contact with the glass substrate 800. Further, when the insulating film is formed over the glass substrate 800, the insulating films 802 and 804 are not necessarily formed.

FIG. 15F is a cross-sectional view for illustrating a bonding step, which illustrates a state where the glass substrate 800 and the single crystal semiconductor substrate 801 are attached to each other. In performing the bonding step, first the glass substrate 800 and the single crystal semiconductor substrate 801 on which the insulating films 802 and 804 are formed are subjected to ultrasonic cleaning. The ultrasonic cleaning is preferably megahertz ultrasonic cleaning (megasonic cleaning). After the megahertz ultrasonic cleaning, one or both of the glass substrate 800 and the single crystal semiconductor substrate 801 can be cleaned with ozone water. By cleaning with ozone water, organic substances can be removed and the surface can be made more hydrophilic.

After the cleaning step, the glass substrate 800 and the single crystal semiconductor substrate 801 are attached to each other with the insulating film 804 therebetween. When a surface of the glass substrate 800 and a surface of the insulating film 804 are disposed in close contact with each other, a chemical bond is formed at an interface between the glass substrate 800 and the insulating film 804, so that the glass substrate 800 and the insulating film 804 are bonded to each other. Since the bonding step can be performed at room temperature without performing heat treatment, a substrate with low heat resistance, like the glass substrate 800, can be used as the substrate to which the single crystal semiconductor substrate 801 is attached.

After the glass substrate 800 and the single crystal semiconductor substrate 801 are disposed in close contact with each other, heat treatment for increasing bonding strength at the interface between the glass substrate 800 and the insulating film 804 is preferably performed. This heat treatment is performed at a temperature at which the weakened layer 803 does not crack, for example, at a temperature higher than or equal to 70° C. and lower than or equal to 300° C.

Next, heat treatment is performed at 400° C. or more, and the single crystal semiconductor substrate 801 is divided along the weakened layer 803 so that a single crystal semiconductor film 806 is separated from the single crystal semiconductor substrate 801. FIG. 15G is a cross-sectional view illustrating a separation step of separating the single crystal semiconductor film 806 from the single crystal semiconductor substrate 801. As illustrated in FIG. 15G, the single crystal semiconductor film 806 is formed over the glass substrate 800 in the separation step. An element denoted by reference numeral 801A is the single crystal semiconductor substrate 801 from which the single crystal semiconductor film 806 is separated.

By performing the heat treatment at 400° C. or more, the hydrogen bond formed at the interface between the glass substrate 800 and the insulating film 804 is changed into a covalent bond. Thus, the bonding strength is increased. Moreover, as the temperature rises, the element added in the ion irradiation step is precipitated to the microvoids formed in the weakened layer 803, so that internal pressure is increased. As the pressure increases, the volume of the microvoids formed in the weakened layer 803 is changed, so that the weakened layer 803 cracks. Thus, the single crystal semiconductor substrate 801 is divided along the weakened layer 803. Since the insulating film 804 is bonded to the glass substrate 800, the single crystal semiconductor film 806 separated from the single crystal semiconductor substrate 801 is fixed over the glass substrate 800. The heat treatment for separating the single crystal semiconductor film 806 from the single crystal semiconductor substrate 801 is performed at a temperature which is not higher than the strain point of the glass substrate 800, and can be performed at a temperature higher than or equal to 400° C. and lower than or equal to 700° C.

After the separation step illustrated in FIG. 15G is completed, an SOI substrate 810 in which the single crystal semiconductor film 806 is attached to the glass substrate 800 is formed. The SOI substrate 810 is a substrate which has a multi-layer structure where the insulating film 804, the insulating film 802, and the single crystal semiconductor film 806 are sequentially stacked over the glass substrate 800, and the SOI substrate 810 is a substrate in which the insulating film 804 and the single crystal semiconductor film 806 are bonded to each other.

Note that the heat treatment for separating the single crystal semiconductor film 806 from the single crystal semiconductor substrate 801 can be performed successively in the same device as in the heat treatment for increasing the bonding strength. Alternatively, the two heat treatments can be performed in different devices. For example, in the case of using the same furnace, first, heat treatment is performed at a treatment temperature of 200° C. for a treatment time of 2 hours. Next, the temperature is raised to 600° C., and heat treatment is performed at 600° C. for 2 hours. Then, the temperature is lowered from a temperature lower than or equal to 400° C. to room temperature, and the single crystal semiconductor substrate 801A and the SOI substrate 810 are taken out from the furnace.

In the case where the heat treatments are performed in different devices, for example, heat treatment is performed at a treatment temperature of 200° C. for a treatment time of 2 hours in a furnace, and after that, the glass substrate 800 and the single crystal semiconductor substrates 801 which are attached to each other are carried out from the furnace. Then, heat treatment is performed at a treatment temperature of 600° C. to 700° C. for a treatment time of 1 minute to 30 minutes, so that the single crystal semiconductor substrate 801 is divided along the weakened layer 803.

Crystal defects are formed in the single crystal semiconductor film 806 in the SOI substrate 810 and the flatness of the surface of the single crystal semiconductor film 806 is damaged due to the formation of the weakened layer 803, the separation step, or the like. Accordingly, in order to reduce the crystal defects and to flatten the surface, the single crystal semiconductor film 806 is preferably irradiated with laser light and melted to be recrystallized. Alternatively, in order to remove the damage of the surface of the single crystal semiconductor film 806 so that the surface is flattened, the surface of the single crystal semiconductor film 806 is preferably polished by a chemical mechanical polishing (CMP) apparatus or the like.

By using the SOI substrate 810 in this embodiment, a photometric device having an SOI structure can be manufactured.

Embodiment 6

By attaching the photometric device in Embodiments 1 to 3 to an electronic device, operations of the electronic device can be controlled in accordance with digital signals of the photometric device. For example, when an electronic device having a display panel is provided with the photometric device, the illuminance of usage environment can be detected by the photometric device, and the luminance of the display panel can be adjusted using digital signals obtained in the photometric device. In this embodiment, several examples of such an electronic device will be described with reference to FIGS. 16A to 16F.

Figure 16A:
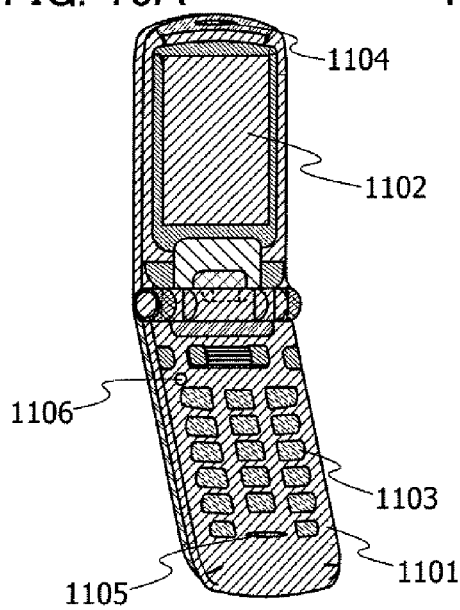
FIGS. 16A and 16B are external views each illustrating an example of a structure of a mobile phone including a photometric device.
Figure 16B:
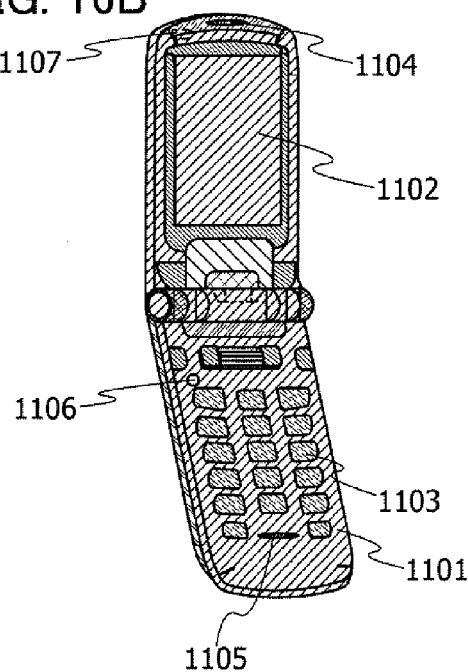

FIGS. 16A and 16B are external views of mobile phones in this embodiment. The mobile phones in FIGS. 16A and 16B each include a main body 1101, a display panel 1102, operation keys 1103, an audio output portion 1104, and an audio input portion 1105. Moreover, the main body 1101 includes a photometric device 1106. The mobile phones in FIGS. 16A and 16B each have a function of controlling the luminance of the display panel 1102 in accordance with electrical signals detected in the photometric device 1106. Further, in the mobile phone in FIG. 16B, the main body 1101 is provided with a photometric device 1107 for detecting the luminance of a backlight of the display panel 1102.

Figure 16C:
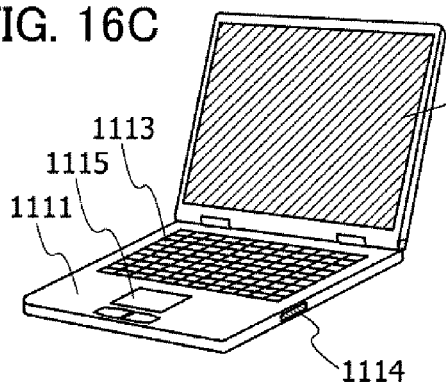
FIG. 16C is an external view illustrating an example of a structure of a computer including a photometric device.

FIG. 16C is an external view of a computer in this embodiment. The computer includes a main body 1111, a display panel 1112, a keyboard 1113, an external connection port 1114, a pointing device 1115, and the like. Further, the main body 1111 is provided with a photometric device (not illustrated) for detecting the luminance of a backlight of the display panel 1112.

Figure 16D:
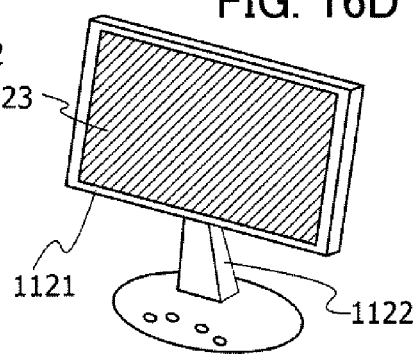
FIG. 16D is an external view illustrating an example of a structure of a display device including a photometric device.

FIG. 16D is an external view of a display device in this embodiment. A television receiver, a monitor of a computer, or the like corresponds to the display device. The display device includes a housing 1121, a support base 1122, a display panel 1123, and the like. The housing 1121 is provided with a photometric device (not illustrated) for detecting the luminance of a backlight of the display panel 1123.

Figure 16E:
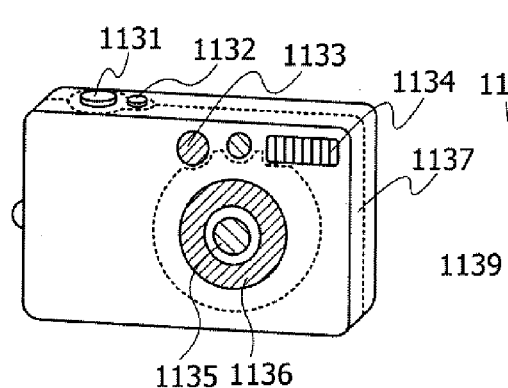
FIGS. 16E and 16F are external views illustrating an example of a structure of a digital camera including a photometric device.
Figure 16F:
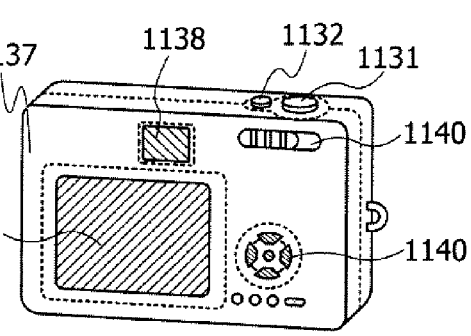

FIG. 16E is an external view of a digital camera in this embodiment when viewed from the front side. FIG. 16F is an external view of the digital camera when viewed from the back side. The digital camera includes a release button 1131, a main switch 1132, a finder window 1133, a flashlight 1134, a lens 1135, a lens barrel 1136, a housing 1137, a finder eyepiece window 1138, a display panel 1139, operation buttons 1140, and the like. By mounting a photometric device on the digital camera, the luminance of photographing environment can be detected by the photometric device. Exposure, shutter speed, and the like can be adjusted in accordance with electrical signals detected in the photometric device.

Example 1

This example will show that a variable clock signal generation circuit and a fixed clock signal generation circuit in a photometric device have the same structure so that, if electric characteristics, reference voltage, and the like of semiconductor elements included in the two clock signal generation circuits are different from design values, an error of the count value of digital signals generated in the photometric device can be made smaller than the difference between the electric characteristics, reference voltage, and the like; and the design values. Circuit simulation was performed to prove the above.

A photometric device subjected to the circuit simulation was the photometric device 10 in FIG. 1, the oscillation circuit in FIG. 3 was applied to the variable clock signal generation circuit 101, and the oscillation circuit in FIG. 6 was applied to the fixed clock signal generation circuit 105. As has been described in Embodiment 2, the frequency $f_1$ of the clock signal CLK1 generated in the fixed clock signal generation circuit 105 in FIG. 6 can be represented by Formula 5, and the frequency $f_2$ of the clock signal CLK2 generated in the variable clock signal generation circuit 101 in FIG. 3 can be represented by Formula 6.

In Formula 5, $C_1$ is a capacitance value of the capacitor 249; and $Z_{11}$ is a proportionality constant, which is similar to $Z_4$ in Formula 4, and a constant determined by the amplification factor of the photocurrent amplifier circuit 210, electric characteristics of the transistors 241 to 248 included in the ramp signal generation circuit 221, and the like. Further, in Formula 6, $C_2$ is a capacitance value of the capacitor 149; and $Z_{12}$ is a proportionality constant, which is similar to $Z_4$.

[Formula 5]
$$f_1 = Z_{11} \frac{I_1}{2 \times C_1(VREFH - VREFL)} \quad (5)$$

[formula 6]
$$f_2 = Z_{12} \frac{Ipd}{2 \times C_2(VREFH - VREFL)} \quad (6)$$

In the circuit simulation in this example, the degree of error of the count value CNT of digital signals output from the photometric device 10 when the capacitance value $C_2$ of the capacitor 149 in the variable clock signal generation circuit 101 and the capacitance value $C_1$ of the capacitor 249 deviate from the design values was calculated. In the circuit simulation, $Z_{11}=Z_{12}=1$ is given in Formulae 5 and 6, and electric characteristics (e.g., the threshold voltage of the transistor) of the circuits 101 and 105 other than the capacitance values $C_1$ and $C_2$ were ignored in the calculation of the frequency $f_1$ and the frequency $f_2$. Table 1 shows the circuit simulation result. SmartSpice was used for the circuit simulator.

TABLE 1

| Fluctuation coefficient of $C_1$ and $C_2$ | Count value CNT | | Measurement period $T_M$ | | Frequency $f_2$ | |
| --- | --- | --- | --- | --- | --- | --- |
| | Calculated value | Fluctuation coefficient [%] | Calculated value [sec] | Fluctuation coefficient [%] | Calculated value [Hz] | Fluctuation coefficient [%] |
| +20% | 105 | −0.9 | 0.305 | +19.7 | 346.4 | −15.5 |
| 0% (Designed value) | 106 | 0 | 0.255 | 0 | 410.0 | 0 |
| −20% | 107 | +0.9 | 0.204 | −19.7 | 501.5 | +22.3 |

Measurement period $T_M$ = count value CNT × frequency $f_1$

Numeric values in Table 1 were calculated under conditions where the power supply voltage VDD of 2.5 V and the power supply voltage VSS of the ground potential are supplied to the photometric device 10 and the photometric device 10 detects light with an illuminance of 100 lux. Table 1 shows the count value CNT, which is a data value of a digital signal; the frequency $f_2$ of the clock signal CLK2 generated in the variable clock signal generation circuit 101; and the measurement period $T_M$ at which the illuminance of light is measured. The measurement period $T_M$ is obtained by multiplying the frequency $f_1$ of the clock signal CLK1 of the fixed clock signal generation circuit 105 by the count value CNT.

Moreover, in the circuit simulation, numeric values (CNT, $T_M$, and $f_2$) and fluctuation coefficients thereof from the design values were calculated in the case where $C_1$ and $C_2$ are design values and fluctuate −20% and +20% from the design value under the condition where $C_1=C_2$. The reason the condition of the capacitance values $C_1$ and $C_2$ is set is that semiconductor elements included in one photometric device 10 are formed in the same manufacturing steps, and thus, it is assumed that fluctuations from the design values of electric characteristics of the semiconductor elements having the same structure in the photometric device 10 are approximately the same.

As shown in Table 1, even though the capacitance values $C_1$ and $C_2$ are different from the design values by ±20%, the fluctuation coefficient of the count value CNT is approximately ±1%, which is extremely small. On the other hand, the fluctuation coefficients of the frequency $f_2$ of the clock signal CLK2 and the measurement period $T_M$ from the designed values are approximately ±20%, which are equivalent to the fluctuation coefficients of the capacitance values $C_1$ and $C_2$.

The reason the fluctuation coefficient of the count value CNT from the design value is smaller than that of the capacitance values $C_1$ and $C_2$ is as follows. Even if the measurement period $T_M$ is shorter (even if the clock signal CLK1 of the fixed clock signal generation circuit 105 is faster), the clock signal CLK2 of the variable clock signal generation circuit 101 becomes faster approximately to the same extent. Moreover, even if the measurement period $T_M$ is longer (even if the clock signal CLK1 of the fixed clock signal generation circuit 105 is slower), the clock signal CLK2 of the variable clock signal generation circuit 101 becomes slower approximately to the same extent. The reason the frequency $f_2$ is linked to the measurement period $T_M$ (the frequency $f_1$) as described above is that the variable clock signal generation circuit 101 has the same structure as the fixed clock signal generation circuit 105.

For example, when the capacitor 149 (see FIG. 3) and the capacitor 249 (see FIG. 6) are formed in the same steps, even if the capacitance values $C_1$ and $C_2$ are different from the design values, the fluctuations from the design values often show the same tendency. Therefore, as shown by the calculation result of Table 1, the clock signal CLK1 of the fixed clock signal generation circuit 105 and the clock signal CLK2 of the variable clock signal generation circuit 101 cancel out the fluctuations of the capacitance values $C_1$ and $C_2$ from the design values, which results in reducing the effect on the count value CNT.

As described above, the circuit simulation in this example showed that errors of the count value CNT (data of the digital signal), that is, measurement errors of the amount of light can be reduced when the variable clock signal generation circuit and the fixed clock signal generation circuit have the same structure.

This application is based on Japanese Patent Application serial no. 2008-166334 filed with Japan Patent Office on Jun. 25, 2008, the entire contents of which are hereby incorporated by reference.

What is claimed is:

1. A photometric device comprising:
a constant current generation circuit configured to output a constant current;
a first clock signal generation circuit configured to generate a first clock signal, the first clock signal oscillating at a frequency proportional to the constant current, the first clock signal generation circuit comprising:
a first ramp signal generation circuit;
a first hysteresis comparator circuit connected to the first ramp signal generation circuit; and
a first buffer circuit connected to the first ramp signal generation circuit and the first hysteresis comparator circuit;
a photoelectric conversion element configured to generate a photocurrent when receiving light;
a second clock signal generation circuit configured to generate a second clock signal, the second clock signal oscillating at a frequency proportional to the photocurrent, the second clock signal generation circuit comprising:
a second ramp signal generation circuit;
a second hysteresis comparator circuit connected to the second ramp signal generation circuit; and
a second buffer circuit connected to the second ramp signal generation circuit and the second hysteresis comparator circuit; and
a digital signal generation circuit configured to count the number of pulses of the second clock signal, the digital signal generation circuit configured to output a digital signal including a count value of the number of pulses, the digital signal generation circuit configured to set a timing when counting of the number of pulses of the second clock signal starts and a timing when the counting finishes, based on the first clock signal.

2. The photometric device according to claim 1,
wherein the second clock signal generation circuit includes a photocurrent amplifier circuit, and the photocurrent amplifier circuit is configured to amplify the photocurrent by x times ($x \geq 1$) or more, and
wherein the second clock signal generation circuit is configured to generate the second clock signal from an amplified current, and the amplified current is output from the photocurrent amplifier circuit.

3. The photometric device according to claim 1,
wherein the first clock signal generation circuit includes a constant current amplifier circuit, the constant current amplifier circuit is configured to amplify the constant current by y times ($y \geq 1$) or more, and the first clock signal generation circuit is configured to generate the first clock signal from an amplified current which is output from the constant current amplifier circuit, and
wherein the second clock signal generation circuit includes a photocurrent amplifier circuit, the photocurrent amplifier circuit is configured to amplify the photocurrent by x times ($x \geq 1$) or more, and the second clock signal generation circuit is configured to generate the second clock signal from an amplified current which is output from the photocurrent amplifier circuit.

4. The photometric device according to claim 1,
wherein the second clock signal generation circuit includes a photocurrent amplifier circuit, and the photocurrent amplifier circuit is configured to amplify the photocurrent by x times ($x \geq 1$) or more,
wherein the second clock signal generation circuit is configured to generate the second clock signal from an amplified current, and the amplified current is output from the photocurrent amplifier circuit, and
wherein the photocurrent amplifier circuit is a current mirror circuit.

5. The photometric device according to claim 1,
wherein the first clock signal generation circuit includes a constant current amplifier circuit, the constant current amplifier circuit is configured to amplify the constant current by y times ($y \geq 1$) or more, and the first clock signal generation circuit is configured to generate the first clock signal from an amplified current which is output from the constant current amplifier circuit,
wherein the second clock signal generation circuit includes a photocurrent amplifier circuit, the photocurrent amplifier circuit is configured to amplify the photocurrent by x times ($x \geq 1$) or more, and the second clock signal generation circuit is configured to generate the second clock signal from an amplified current which is output from the photocurrent amplifier circuit, and
wherein each of the photocurrent amplifier circuit and the constant current amplifier circuit is a current mirror circuit.

6. An electronic device comprising:
the photometric device according to claim 1; and
a display panel,
wherein display luminance of the display panel is adjusted in accordance with the digital signal.

7. The photometric device according to claim 1, wherein the second clock signal generation circuit has the same structure as the first clock signal generation circuit.

8. A photometric device comprising:
a constant current generation circuit configured to output a constant current;
a first clock signal generation circuit configured to generate a first clock signal, the first clock signal oscillating at a frequency proportional to the constant current, the first clock signal generation circuit comprising:
a first ramp signal generation circuit;
a first hysteresis comparator circuit connected to the first ramp signal generation circuit; and
a first buffer circuit connected to the first ramp signal generation circuit and the first hysteresis comparator circuit;
a photoelectric conversion element configured to generate a photocurrent when receiving light;
a second clock signal generation circuit including a photocurrent amplifier circuit including a first amplifier circuit configured to amplify the photocurrent and a second amplifier circuit having an amplification factor different from that of the first amplifier circuit, the photocurrent amplifier circuit being configured to output a first amplified photocurrent amplified by the first amplifier circuit and a second amplified photocurrent amplified by the second amplifier circuit,
a gain switching circuit configured to output one of the first amplified photocurrent and the second amplified photocurrent which are input to the gain switching circuit, and
a third clock signal generation circuit configured to generate a second clock signal from one of the first amplified photocurrent and the second amplified photocurrent which are output from the gain switching circuit, the second clock signal oscillating at a frequency proportional to the photocurrent, the third clock signal generation circuit comprising:
a second ramp signal generation circuit;
a second hysteresis comparator circuit connected to the second ramp signal generation circuit; and a second buffer circuit connected to the second ramp signal generation circuit and the second hysteresis comparator circuit; and a digital signal generation circuit configured to count the number of pulses of the second clock signal, the digital signal generation circuit configured to output a digital signal including a count value of the number of pulses, and the digital signal generation circuit configured to set a timing when counting of the number of pulses of the second clock signal starts and a timing when the counting finishes, based on the first clock signal.

9. The photometric device according to claim 8, wherein the first clock signal generation circuit includes a third amplifier circuit, the third amplifier circuit is configured to amplify the constant current by y times ($y \geqq 1$) or more, and the first clock signal generation circuit is configured to generate the first clock signal from an amplified constant current amplified by the third amplifier circuit.

10. The photometric device according to claim 8,
wherein the first clock signal generation circuit includes a third amplifier circuit, the third amplifier circuit is configured to amplify the constant current by y times ($y \geqq 1$) or more, and the first clock signal generation circuit is configured to generate the first clock signal from an amplified constant current amplified by the third amplifier circuit, and wherein the third amplifier circuit is a current mirror circuit.

11. The photometric device according to claim 8, wherein each of the first amplifier circuit and the second amplifier circuit in the second clock signal generation circuit is a current mirror circuit.

12. An electronic device comprising:
the photometric device according to claim 8; and
a display panel,
wherein display luminance of the display panel is adjusted in accordance with the digital signal.

13. The photometric device according to claim 8, wherein the first clock signal generation circuit has the same structure as the third clock signal generation circuit.

* * * * *